(12) United States Patent
Kai et al.

(10) Patent No.: US 6,343,043 B2
(45) Date of Patent: Jan. 29, 2002

(54) DYNAMIC RANDOM ACCESS MEMORY

(75) Inventors: Yasukazu Kai, Miyazaki; Takeshi Gotoh, Tokyo, both of (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/754,261

(22) Filed: Jan. 5, 2001

(30) Foreign Application Priority Data

Mar. 13, 2000 (JP) .......................................... 12-068969

(51) Int. Cl.[7] ................................................. G11C 7/00
(52) U.S. Cl. ......................................... 365/222; 365/196
(58) Field of Search .............................. 365/222, 196, 365/236

(56) References Cited

U.S. PATENT DOCUMENTS

| | | | | |
|---|---|---|---|---|
| 5,715,206 A | * | 2/1998 | Lee et al. | 365/222 |
| 5,798,976 A | * | 8/1998 | Arimoto | 365/222 |
| 6,141,279 A | * | 10/2000 | Hur | 365/222 |

FOREIGN PATENT DOCUMENTS

| | | |
|---|---|---|
| JP | 5-242670 | 9/1993 |
| JP | 8-190787 | 7/1996 |
| JP | 9-180442 | 7/1997 |
| JP | 10-27471 | 1/1998 |
| JP | 10-177786 | 6/1998 |
| JP | 63-37893 | 2/1999 |

\* cited by examiner

*Primary Examiner*—Tan T. Nguyen
(74) *Attorney, Agent, or Firm*—Volentine Francos, PLLC

(57) ABSTRACT

In order to reduce power consumption in a dynamic random access memory (DRAM), block selection information RBDATA indicating whether or not individual blocks in a memory cell array require a refresh is stored at means for latching 20-1 and 20-2. A circuit for operation prohibition 30 compares a portion RA8 of a refresh address output by a refresh counter 6 with refresh block specification signals RB (0) and RB (1) output by the circuit for latching 20-1 and 20-2, makes a decision as to whether or not the block indicated by the refresh address needs to be refreshed and prohibits an operation of an RAS system circuit 11 if it is decided that the block does not need to be refreshed. Thus, a self refresh is not performed for a block that does not need to be refreshed to achieve a reduction in power consumption.

20 Claims, 20 Drawing Sheets

DYNAMIC RANDOM ACCESS MEMORY

BACKGROUND OF THE INVENTION

1. Field of the Invention

The present invention relates to a dynamic random access memory (hereafter referred to as "DRAM") which must be refreshed in order to hold data.

2. Description of the Related Art

A DRAM with a large memory capacity is normally provided with a memory cell array constituted of a plurality of memory blocks for data storage. As various mobile products with battery-driven systems have become distributed in ever-increasing numbers in the market in recent years, it has become necessary for DRAM installed in such systems to operate at a lower voltage level and achieve lower power consumption.

The structure of memory cells in DRAM require a refresh operation be performed in order to hold data stored in memory. The refresh operation must be performed continually as long as the stored data are to be sustained, regardless of whether they apparatus or the system in which the DRAM is installed is in an active state or a suspended state.

FIG. 2 is a block diagram of a self refresh control circuit in a DRAM in the prior art.

DRAM in the prior art is provided with a self refresh control circuit, as illustrated in FIG. 2 to achieve self refresh.

Self refresh in the DRAM refers to a refresh operation performed by using a row address strobe signal RASB (the "B" at the end of the code indicates the anti-phase) that, when set to "L", indicates an active state, and a column address strobe signal CASB that, when set to "L", indicates an active state. The refresh is performed when the signal CASB set to "L" after the setup time elapses has been held at "L" over a specific length of time or longer before the signal RASB is set to "L".

The self refresh control circuit is provided with a refresh decision-making circuit 3 connected to an RASB pad 1, through which the signal RASB is input, and a CASB pad 2, through which the signal CASB is input. The refresh decision-making circuit 3 makes a decision as to whether or not a self refresh is requested based upon the signal RASB and the signal CASB, and accordingly generates a refresh enable signal SREF. The output side of the refresh decision-making circuit 3 is connected to a refresh timer 4, a refresh control circuit 5, a refresh counter 6 and an X address buffer 7.

The refresh timer 4, which is activated by the signal SREF, has a function of providing a refresh request signal RREQ to be used as a timing signal to the refresh control circuit 5. The refresh counter 6, which is activated by the signal SREF, generates a refresh address RA (0:i) with an (i+1) bit width for a refresh based upon a counter control clock RCLK. The refresh control circuit 5, which is activated by the signal SREF, outputs an RAS signal for internal use (hereafter referred to as an internal RAS) based upon the signal RREQ, with its output side connected to one of the input terminals of a two-input NOR gate 8 via a node N1. The other input terminal of the NOR gate 8 is connected to the signal RASB pad 1, and the output terminal of the NOR gate 8 is connected to an RAS system circuit 11 via two-stage inverters 9 and 10.

The RAS system circuit 11, which is constituted of a sense amplifier that amplifies the potential difference between individual bit lines BL and BLB in a bit line pair, a timing generator that generates a timing signal (neither shown) and the like, provides the counter control clock RCLK to the refresh counter 6 and provides an X address latch signal LH to the X address buffer 7.

An X address AX (0:i) for normal access is input to the X address buffer 7 through an address pad 12. When the signal SREF is set to "H", the refresh address RA (0:i) is stored, whereas the X address AX (0:i) is stored if the signal SREF is at "L". An X pre-decoder 13 and a plurality of X decoders 14-1, 14-2, . . . are connected to the output side of the X address buffer 7. The X pre-decoder 13 decodes the address stored at the X address buffer 7 to select a memory block, and outputs the X address corresponding to the selected memory block as a pre-decode signal, which is then provided to the X decoders 14-1, 14-2, . . . One of the X decoders 14-1, 14-2 . . . is selected by the pre-decode signal, and the pre-decode signal is then decoded by the selected X decoder to select a word line WL of the memory block connected to the X decoder.

FIG. 3 is a waveform diagram corresponding to the operation explained in reference to FIG. 2. In reference to FIG. 3, the self refresh operation is summarized.

Based upon the signal RASB and the signal CASB, the refresh decision-making circuit 3 generates a refresh enable signal SREF at "H". When the signal SREF is at "H", the refresh timer 4 automatically sets the refresh request signal RREQ to "H" intermittently. Thus, the internal RAS provided to the RAS system circuit 11 alternates between H and L repeatedly. The RAS system circuit 11 provides the counter control clock RCLK to the refresh counter 6, and the refresh counter 6 sequentially outputs the refresh addresses RA (0:i) in synchronization with the counter control clock RCLK. As a result, the refresh addresses RA (0:i) are stored at the X address buffer 7, and the refresh addresses RA (0:i) are decoded by the X pre-decoder 13 and the X decoders 14-1, 14-2 . . . In addition, the word line WL at the selected memory block is selected and the memory cells (not shown) connected to the word line WL become refreshed. This self refresh operation is repeated as long as the signals RASB and CASB remain at "L".

However, the following problem is yet to be addressed with regard to the DRAM in the prior art.

FIG. 4 illustrates the problem of the DRAM in the prior art.

A plurality of memory cells in the DRAM are constituted as, for instance, two 256 kilo-bit (256 kb) memory cell array blocks ABLK1 and ABLK2. Word lines WL inside the individual blocks ABLK1 and ABLK2 are respectively selected by the X decoders 14-1 and 14-2, and bit line pairs BL and BLB inside the two blocks ABLK1 and ABLK2 are selected by a common Y decoder 15. It is assumed that either one of the blocks ABLK1 or ABLK2 is selected in correspondence to the levels of the highest-order bit signal A8X and the X address AX (0:i) and a signal A8XB at the anti-phase of the signal A8X. The signals A8X and A8XB are pre-decoded by the X predecoder 13, and either one of the two blocks ABLK1 and ABLK2 is selected. The one block ABLK1 or ABLK2 selected by the signals A8X and A8XB in this process is a block that is not required to hold data. Since both blocks ABLK1 and ABLK2 undergo the self refresh process regardless of whether or not they need to hold data, power is consumed in a wasteful manner, and thus, it does not satisfy the technological requirement of lower power consumption.

For instance, when the DRAM is utilized to store messages in a mobile telephone or the like, while it is necessary to perform a self refresh for the block (e.g., the block ABLK1) having messages stored therein, the other block ABLK2 does not need to be refreshed. However, since a self refresh is performed for the block ABLK2 which does not need to be rereshed as well in the DRAM in the prior art, battery power is unnecessarily depleted.

SUMMARY OF THE INVENTION

In order to address the problem of the prior art discussed above, in a first aspect of the present invention, a DRAM comprising a plurality of blocks each provided with a plurality of word lines selected by an X address, a plurality of bit lines and a plurality of memory cells for data storage connected to the word lines and the bit lines, a refresh decision-making circuit that detects whether or not a refresh is requested for the plurality of memory cells based upon a control signal provided from the outside and makes a decision with regard to its mode, a refresh timer that is activated when the result of the decision-making performed by the refresh decision-making circuit indicate a self refresh mode to generate a timing signal, a generator that generates a counter control clock that is synchronous with the timing signal, a refresh counter that is activated when the result of the decision-making performed by the refresh decision-making circuit indicate the self refresh mode to generate and output a refresh address for a refresh in synchronization with the counter control clock and an X address buffer that stores the refresh address when the result of the decision-making performed by the refresh decision-making circuit indicates the self refresh mode and stores an X address provided from the outside when the result of the decision-making performed by the refresh decision-making circuit do not indicate the self refresh mode, is provided.

The DRAM according to the present invention is further provided with a means for latching that latches block selection information provided from the outside with specific timing indicating whether not a refresh needs to be performed for the block, an X pre-decoder that pre-decodes the address stored in the X address buffer to select the block and outputs a pre-decode signal containing the selection information, an X decoder that decodes the pre-decode signal and selects a word line corresponding to the memory cells within the block selected by the X pre-decoder, a means for operation prohibition that compares the block selection information latched by the means for latching with the refresh address and prohibits operation of the generator if the refresh address indicates a block that does not need to be refreshed and a means for clock route changing that provides the timing signal to the refresh counter instead of the counter control clock when the operation of the generator is prohibited.

In a second aspect, a DRAM having the plurality of blocks, the refresh decision-making circuit, the refresh timer, the generator, the refresh counter, the X address buffer, the means for latching, the X pre-decoder and the X decoder in the DRAM in the first aspect is provided. The X pre-decoder in the second aspect compares the block selection information latched by the means for latching with the refresh address stored at the X address buffer when the result of the decision-making performed by the refresh decision-making circuit indicate the self refresh mode, outputs a pre-decode signal at a first potential containing information indicating a block specified by the refresh address that needs to be refreshed and sets the pre-decode signal to a second potential if the refresh address specifies a block that does not need to be refreshed. In addition, the X decoder decodes the pre-decode signal at the first potential output by the X pre-decoder to select a word line corresponding to the memory cells within the block specified by the X pre-decoder, whereas the word line selection operation is prohibited if the pre-decode signal is set to the second potential.

In a third aspect, a DRAM comprising a plurality of blocks each provided with a plurality of word lines selected by an X address, a plurality of bit lines and a plurality of memory cells for data storage connected to the word lines and the bit lines, a refresh decision-making circuit that detects whether or not a refresh is requested for the plurality of memory cells based upon a control signal provided from the outside and makes a decision with regard to its mode, a refresh timer that is activated when the result of the decision-making performed by the refresh decision-making circuit indicate a self refresh mode to generate a timing signal, a generator that generates a counter control clock that is synchronous with the timing signal, a means for counter activation that outputs an activation signal set to a first potential when the result of the decision-making performed by the refresh decision-making circuit indicate a self refresh mode or a refresh mode other than the self refresh mode and set to a second potential if the result of the decision-making indicate neither the self refresh mode nor a refresh mode other than the self refresh mode and a refresh counter that is activated by the activation signal set to the first potential to generate and output a refresh address for a refresh in synchronization with the counter control clock, is provided.

The DRAM is further provided with an X address buffer having the activation signal input therein, that stores the refresh address when the activation signal is at the first potential and stores an X address provided from the outside if the activation signal is set to the second potential, a means for latching that latches block selection information provided from the outside with specific timing indicating whether or not it is necessary to refresh the block, an X pre-decoder that compares the block selection information latched by the means for latching with the refresh address stored at the X address buffer, outputs a pre-decode signal at the first potential containing information indicating a block specified by the refresh address that requires a refresh and sets the pre-decode signal to the second potential if the refresh address specifies a block that does not need to be refreshed and an X decoder that decodes the pre-decode signal at the first potential output by the X pre-decoder to select a word line corresponding to the memory cells within the block specified by the X pre-decoder with its word line selection operation prohibited if the pre-decode signal is set at the second potential.

In a fourth aspect, the block selection information is input via a pad for inputting/outputting the data from/to the outside or via a pad through which the X address is input from the outside in the DRAM provided in the first, second or third aspect.

In a fifth aspect, a shift register connected to the pad in the DRAM provided in the fourth aspect is provided instead of the means for latching, and the block selection information is latched by the shift register.

In a sixth aspect, a means for refresh mode setting that has a function of setting a first refresh mode for performing a selective block refresh and a second refresh mode for performing a refresh for all the blocks, outputs a pre-decode signal at either the first or the second potential from the X pre-decoder when the first refresh mode is set and provides a signal that prohibits the pre-decode signal from shifting to the second potential to the X pre-decoder when the second refresh mode is set, is provided in any of the DRAM achieved in the second~fifth aspects.

In a seventh aspect, a selection signal indicating whether or not a refresh is necessary for each of a plurality of areas achieved by further dividing each of the blocks is input and the refresh is performed only for the memory cells in an area that requires a refresh within a block requiring the refresh in any of the DRAM achieved in the first~sixth aspects.

In an eighth aspect, the block selection information and the selection signal are input through a common pad and a means for switching that switches between the destination for the input block selection information and the destination for the input selection signal is provided in the DRAM achieved in the seventh aspect.

In a ninth aspect, a means for block selection information generation that pre-decodes the X address input from the outside via the pad and generates the block selection information based upon the results of decoding is provided in any of the DRAM achieved in the fourth~eighth aspects.

In the DRAM in the first~ninth aspects structured as described above, the block selection information indicating whether or not an individual block needs to be refreshed, which is provided from the outside, is latched, for instance, by the means for latching as in the first aspect. The means for operation prohibition compares the block selection signal with the refresh address, and the operation of the generator is halted if the refresh address indicates a block that does not require a self refresh. Thus, a refresh operation is not performed for blocks that do not need to be refreshed. Since the means for clock route changing provides the timing signal to the refresh counter instead of the counter control clock during this process, the refresh counter is allowed to generate a refresh address even while the generator is not engaged in an operation so that a self refresh for another block is sustained.

In the DRAM achieved in the second aspect, the block selection signal indicating whether or not the individual blocks need to be refreshed, which is provided from the outside, is latched by the means for latching. The X pre-decoder compares the block selection information and the refresh address if the refresh decision-making circuit specifies the self refresh mode. Then, if the refresh address specifies a block that requires a self refresh, the pre-decode signal is set to the first potential, whereas the pre-decode signal is set to the second potential and is provided to the X decoder if the refresh address specifies a block that does not require a self refresh. When the pre-decode signal is set to the first potential, the X decoder decodes the pre-decode signal to select memory cells inside the selected block, but it does not engage in a memory selection operation if the pre-decode signal is set to the second potential. Thus, a self refresh is performed only for the selected block.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS (First Embodiment)

Figure 1:
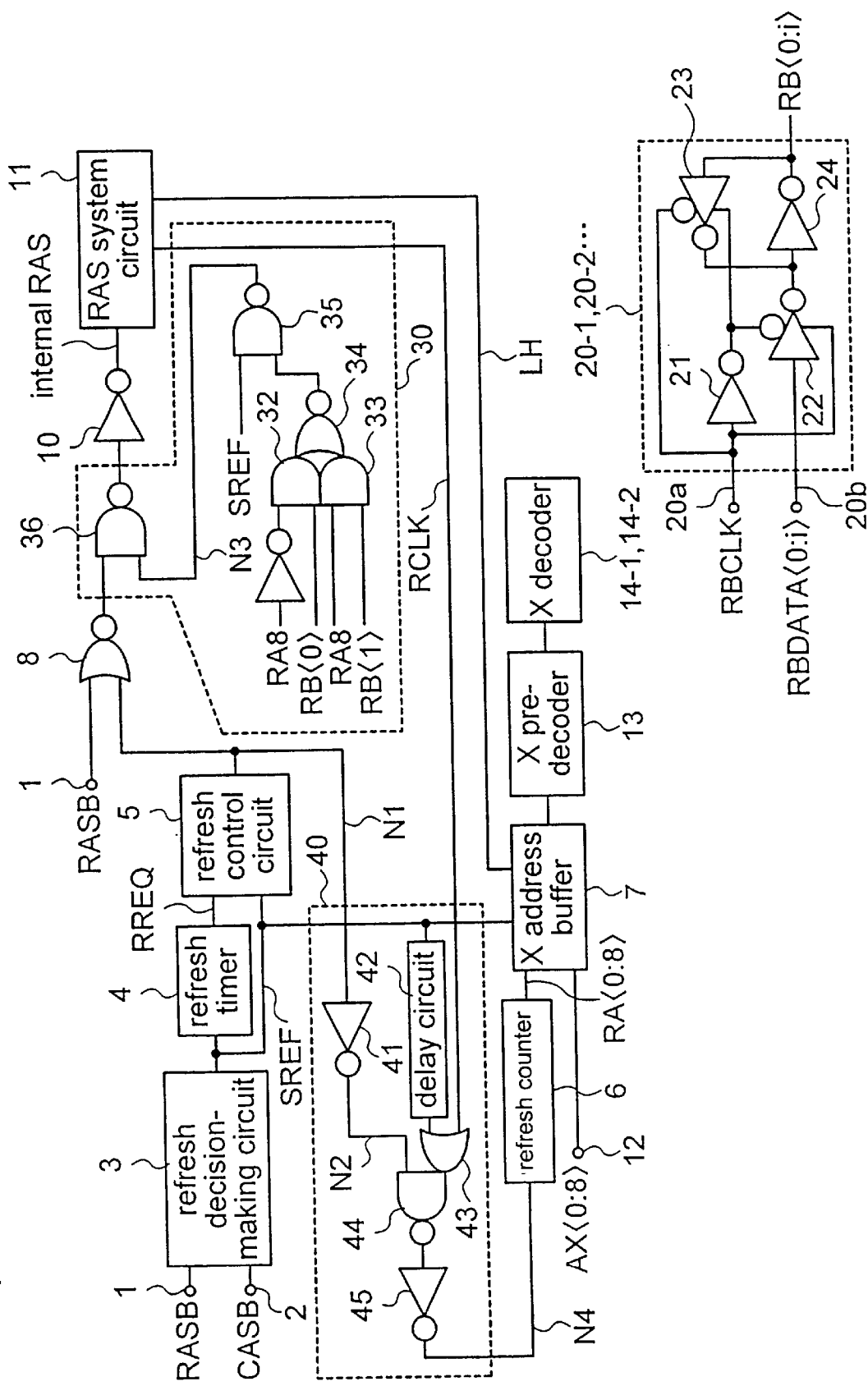
FIG. 1 is a block diagram of an essential portion of the DRAM in the first embodiment of the present invention.
Figure 2:
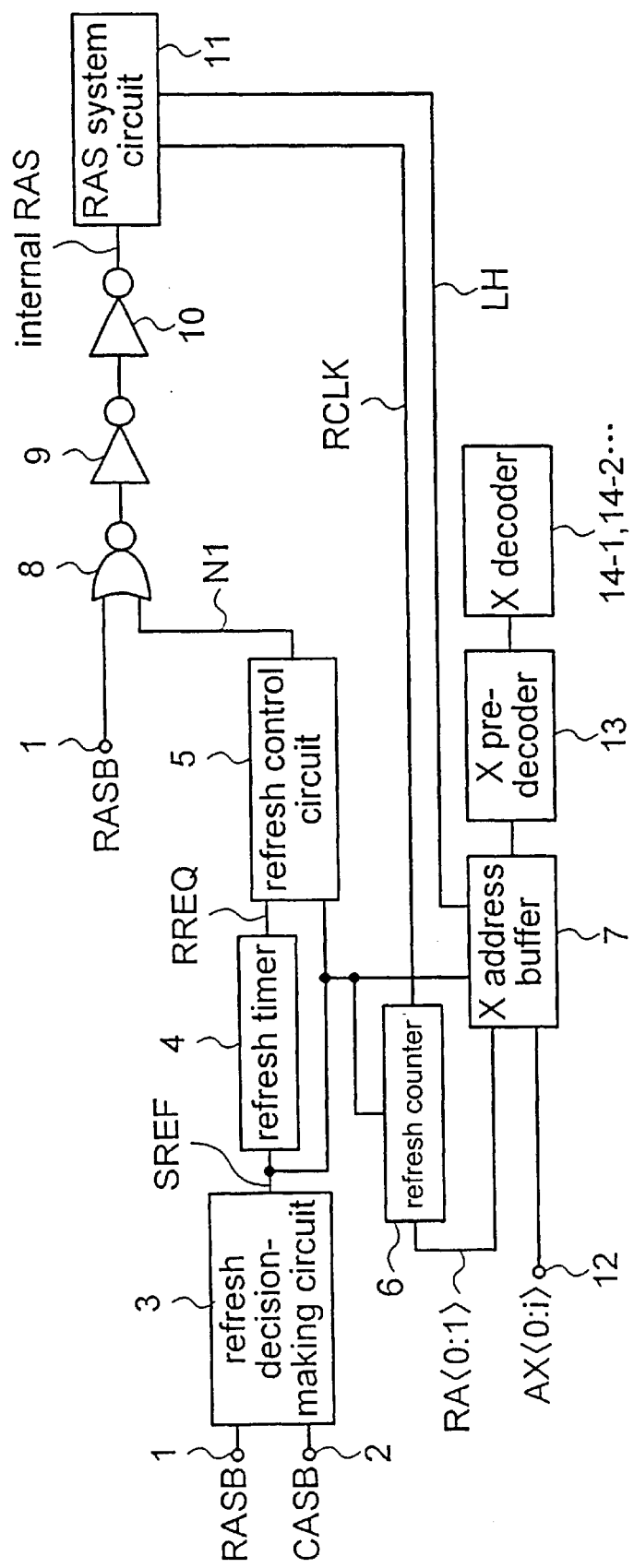
FIG. 2 is a block diagram of the self refresh control circuit employed in a DRAM in the prior art.
Figure 3:
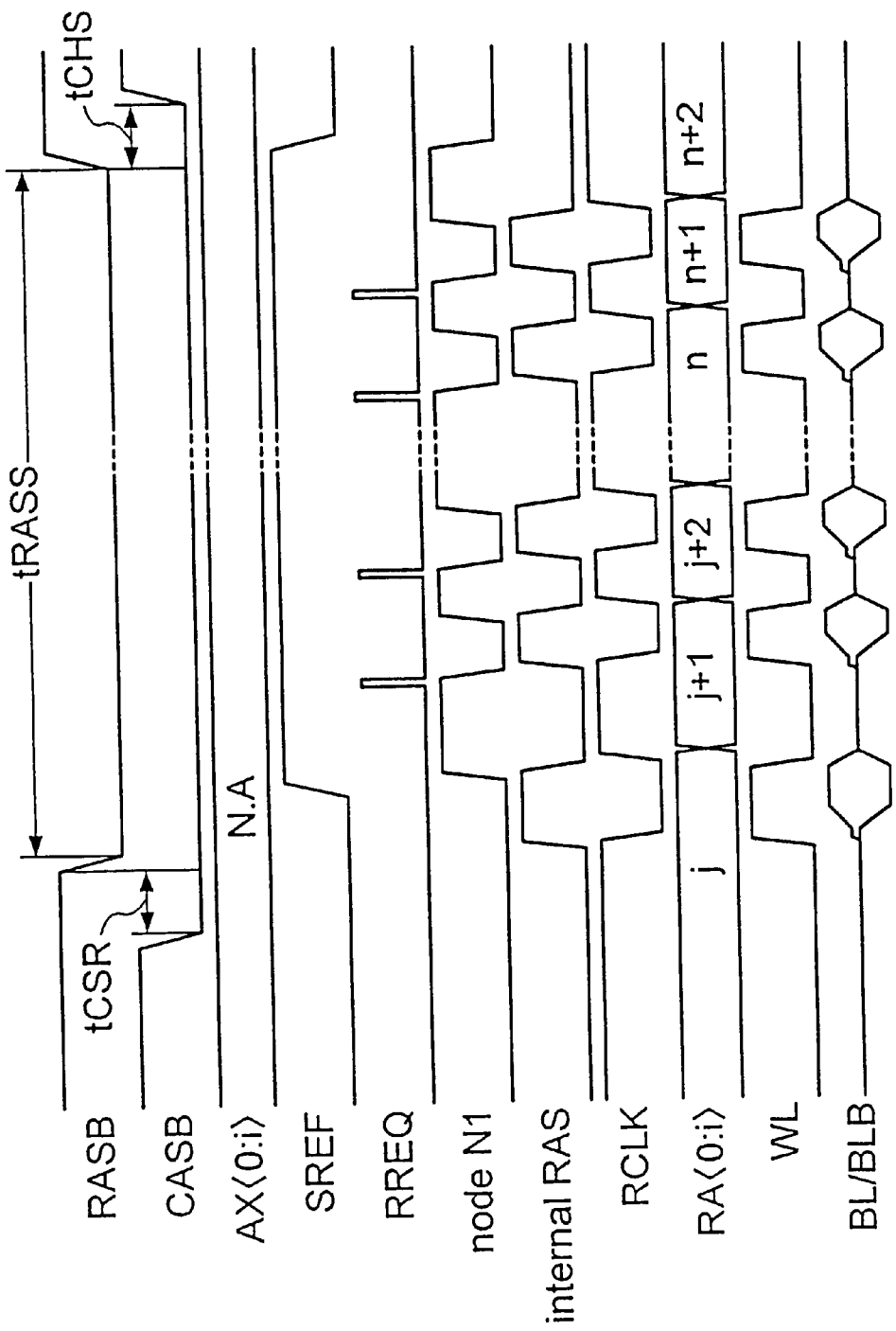
FIG. 3 is a waveform diagram corresponding to the operation achieved in the self refresh control circuit in FIG. 2.

FIG. 1 is a block diagram of an essential portion of the DRAM in the first embodiment of the present invention, with the same reference numbers assigned to elements identical to those in FIG. 2 illustrating the prior art for purposes of simplification.

Figure 4:
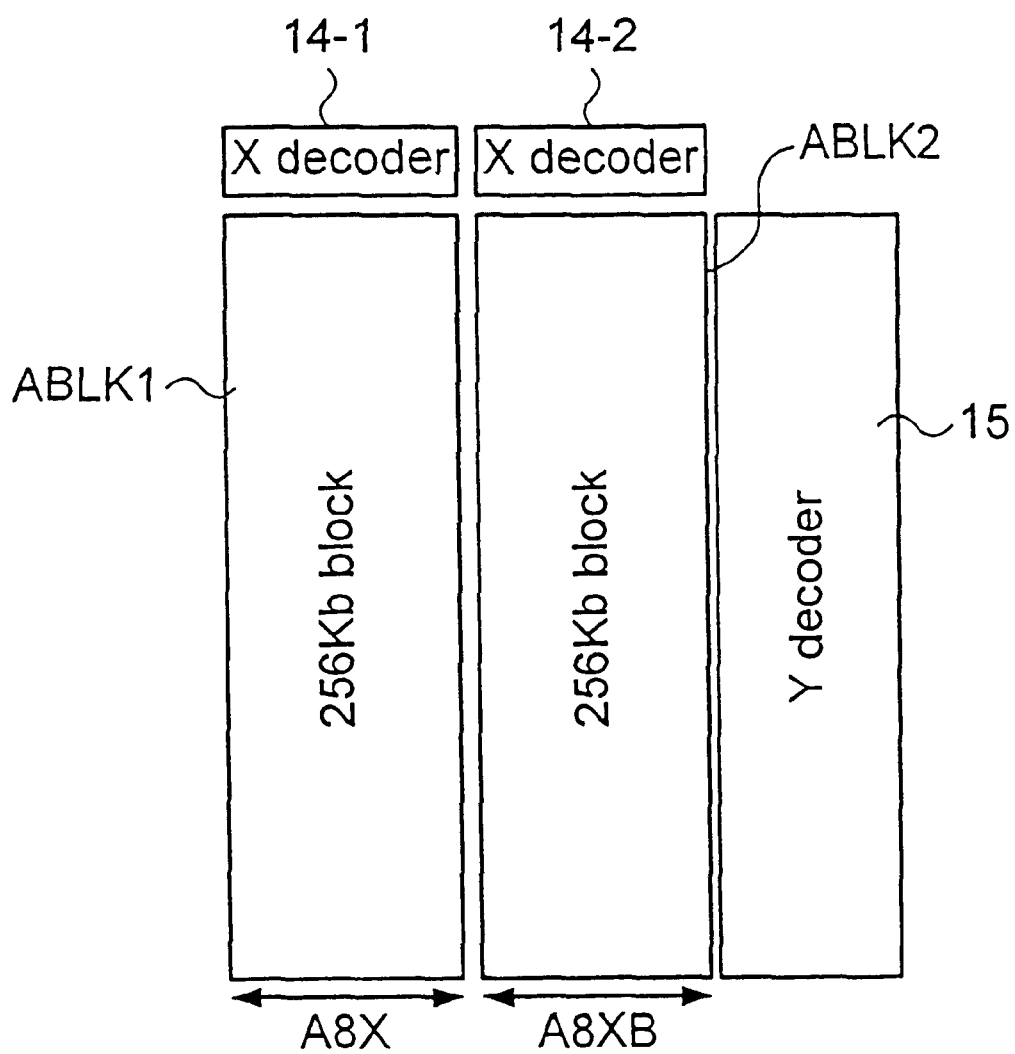
FIG. 4 illustrates the problem of the DRAM in the prior art.

This DRAM is achieved by providing a plurality of (e.g., 2) means for latching 20-1 and 20-2, a means for operation prohibition 30 and a means for clock route changing 40 in the DRAM in the prior art shown in FIG. 2. The two means for latching 20-1 and 20-2 store refresh block data RBDATA (0:1) constituting block selection information for specifying a block to undergo a self refresh. The means for operation prohibition 30 prohibits operation of a generator (e.g., a RAS system circuit) 11 by fixing an internal RAS. While the means for latching 20-1 and 20-2 and the means for operation prohibition 30 assume a circuit structure for supporting a memory cell array divided into two blocks, i.e., blocks ABLK 1 and ABLK2, as illustrated in FIG. 4 in this example, the number of blocks is not restricted to two.

The means for latching 20-1 and 20-2 are each provided with an inverter 21, a clocked inverter 22, a clocked inverter 23 and an inverter 24. The inverter 21 is connected to an input pad 20a through which a clock RBCLK for block selection information latching provided from the outside of the chip is input. The clocked inverter 22 is connected to an input pad 20b through which refresh block data RBDATA (0:1) for selecting the block ABLK1 or the block ABLK2 to undergo a refresh are input. The input terminal and the output terminal of the inverter 21 are connected to the clocked inverters 22 and 23 to allow the clock to be applied. The output terminal of the clocked inverter 22 is connected to the input terminal of the inverter 24, and the output terminal of the inverter 24 is connected to the input terminal of the clocked inverter 23. The output terminal of the clocked inverter 23 is connected to the input terminal of the inverter 24 provided to output a refresh block specification signal RB (0:1).

As in the prior art, a refresh decision-making circuit 3 is connected to an RASB pad 1 through which a signal RASB to be used as a control signal is input and a CASB pad 2 through which a signal CASB is input. The refresh decision-making circuit 3 makes a decision as to whether or not a self refresh is requested based upon the signal RASB and the signal CASB and accordingly generates a refresh enable signal SREF. A refresh timer 4 similar to that employed in the prior art and a refresh control circuit 5 for generating an internal RAS are connected to the output side of the refresh decision-making circuit 3. The refresh timer 4 has a function of providing a refresh request signal RREQ which is to be used as a timing signal to the refresh control circuit 5, and the output side of the refresh timer 4 is connected to the refresh control circuit 5. The output side of the refresh decision-making circuit 3 and an output-side node N 1 of the refresh control circuit 5 are connected to the means for clock route changing 40.

The means for clock route changing 40 is provided with an inverter 41 with its input terminal connected with the node N 1 and a delay circuit 42 constituted of inverters provided over an even number of stages. The output side of the refresh decision-making circuit 3 is connected to the input side of the delay circuit 42. The output side of the delay circuit 42 is connected to one of the input terminals of a two-input OR gate 43. A counter control clock RCLK from the RAS system circuit 11 is input to the other input terminal of the OR gate 43. The output terminal of the OR gate 43 is connected to one of the input terminals of a two-input NAND gate 44, with the other input terminal of the NAND gate 44 connected to a node N 2 on the output terminal side of the inverter 41. The output terminal of the NAND gate 44 is connected to a refresh counter 6 via an inverter 45.

The refresh counter 6 generates a refresh address RA (0:8), with an X address buffer 7 connected to its output side. An X pre-decoder 13 is connected to the output side of the X address buffer 7, and two X decoders 14-1 and 14-2, for instance, are connected to the output side of the X pre-decoder 13.

The output-side node N 1 at the refresh control circuit 5 is connected to one of the input terminals of a two-input NOR gate 8, with the other input terminal of the NOR gate 8 connected to the RASB pad 1. The output terminal of the NOR gate 8 is connected to the means for operation prohibition 30.

The means for operation prohibition 30 is provided with an inverter 31 to which the highest-order bit signal RA8 of the refresh address RA (0:8) generated by the refresh counter 6 is input, a two-input AND gate 32, to which an output signal from the inverter 31 and a lower-order bit signal RB (0) in the refresh block specification signal RB (0:1) provided by the means for latching 20-1, 20-2 are input, and a two-input AND gate 33 to which a higher-order bit signal RB (1) in the signal RB (0:1) and the signal RA8 are input.

A two-input NOR gate 34 is connected to the output terminals of the AND gates 32 and 33, with one of the input terminals of a two-input NAND gate 35 connected to the output terminal of the NOR gate 34. The refresh enable signal SREF output by the refresh decision-making circuit 3 is input to the other input terminal of the NAND gate 35. A node N 3 located on the output terminal side of the NAND gate 35 is connected to one of the input terminals of a two-input NAND gate 36. The other input terminal of the NAND gate 36 is connected to the output terminal of the NOR gate 8.

As in the prior art, an inverter 10 is connected to the output terminal of the NAND gate 36 at the means for operation prohibition 30, and the RAS system circuit 11 connected to the output terminal of the inverter 10. The RAS system circuit 11 is provided with a timing generator to which the internal RAS is input, a counter control clock generator, a sense amplifier that detects and amplifies the potential difference between the individual bit lines BL and BLB in the bit line pair and the like. The RAS system circuit 11 provides the counter control clock RCLK to the means for clock route changing 40 and provides an X address latch signal LH to the X address buffer 7.

Figure 5:
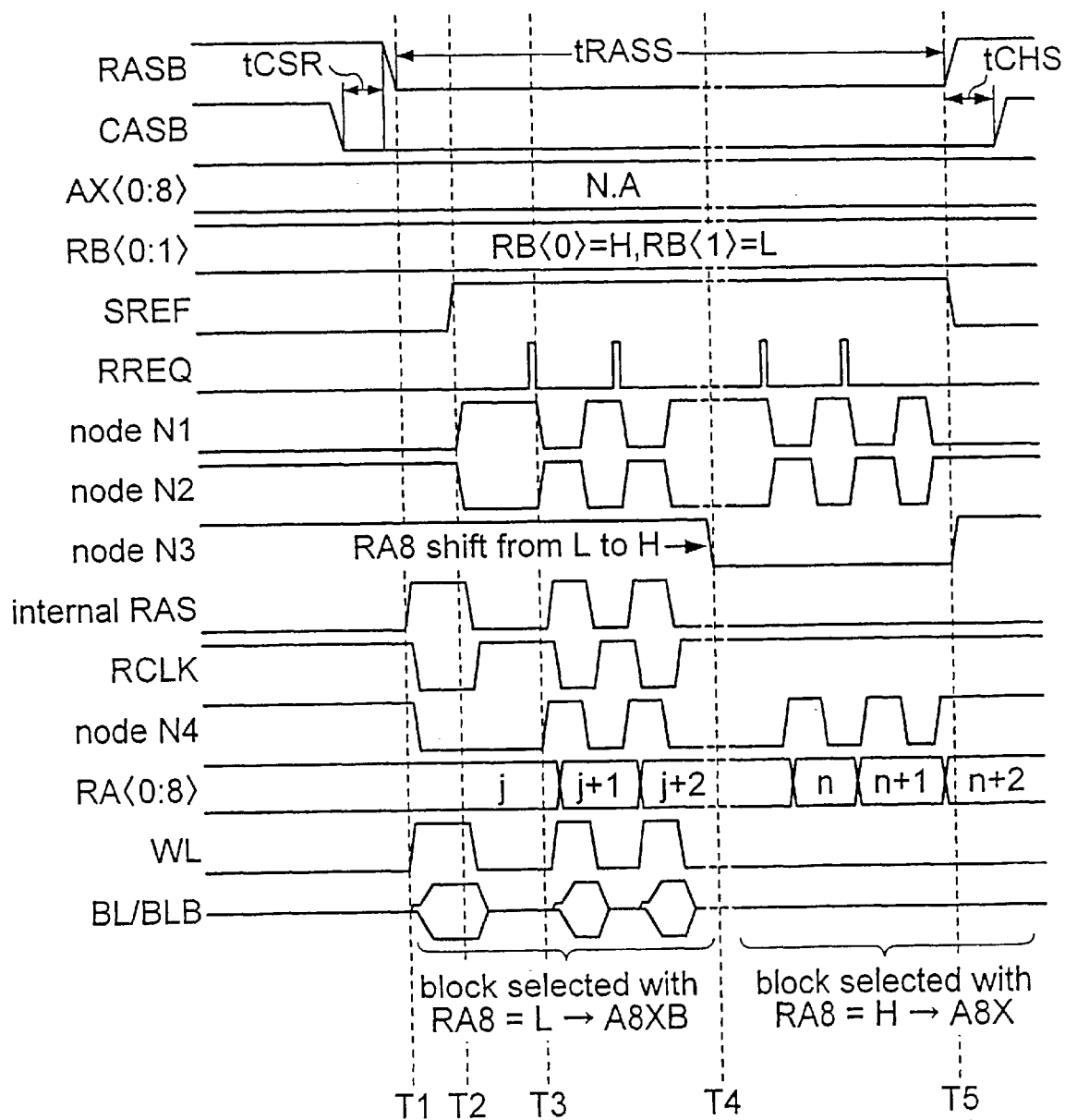
FIG. 5 is a waveform diagram corresponding to the operation achieved in the DRAM in FIG. 1.

FIG. 5 is a waveform diagram corresponding to the operation achieved in the DRAM shown in FIG. 1. In reference to FIG. 5, a self refresh operation is now explained.

Prior to the start of a self refresh operation, refresh block data RBDATA (0:1) for selecting either the block ABLK1 or ABLK2 to undergo a refresh are provided to the pads 20*b* of the means for latching 20-1 and 20-2 and a one-pulse clock RBCLK is input through the pads 20*a*. In response to the means for latching 20-1 and 20-2 latch the data RBDATA (0:1) as a two-bit refresh block specification signal RB (0:1). The explanation is given here on the assumption that the latched signals RB (0) and RB (1) respectively indicate "H" and "L".

By setting the signal CASB to "L" level when the setup time has elapsed before the signal RASB is set to "L", setting the signal RASB to "L" at a time point T1 when a period of time tCSR has elapsed and sustaining the signals CASB and RASB at "L" for a specific length of time tRASS or longer in this state, the DRAM is set in the self refresh mode.

At the time point T1 at which the signal RASB has fallen to "L", the internal RAS output by the inverter 10 is set to "H". With the internal RAS at "H", the RAS system circuit 11 starts an operation to provide the X address latch signal LH to the X address buffer 7. At the same time, the counter control clock RCLK is set to "L", and in synchronization, a node N 4 on the output side of the inverter 45 is set to "L". As a result, the refresh address RA (0:8) currently output by the refresh counter 6 is stored at the X address buffer 7. The refresh address RA (0:8) is pre-decoded by the X pre-decoder 13, and the X decoder 14-1 or 14-2 is selected by a decoded pre-decode signal PA8X or PA8XB (corresponding to the signals A8X and A8XB). For instance, when the signal RA8 is at "H", the X decoder 14-1 corresponding to the block ABLK1 is selected, and the X decoder 14-1 thus selected sets the word line WL specified by the lower-order side of the refresh address RA (0:8) to "H" to perform a refresh for the memory cells connected to the word line WL and the bit line pair (BL, BLB).

When the refresh enable signal SREF shifts to "H" at a time point T2, the node N 1 is set to "H", the node N 2 is set to "L" and the node N 4 is sustained at "L". The delay circuit 42 functions at this time to ensure that no whisker noise is superimposed at the node N 4. At the time point T2, the highest-order bit signal RA8 in the refresh address RA (0:8) output by the refresh counter 6 is at "L" and the signal RB (0) is at "H" and, as a result, the node N 3 sustains an "H" state even after the signal SREF is set to "H". In response to the node N 1 shifting to "H", the internal RAS shifts to "L", thereby ending a first refresh cycle.

At a time point T3, the refresh request signal RREQ is output from the refresh timer 4 and in response, the refresh control circuit 5 engages in an operation to set the node N 1 to "L". With the node N 1 set to "L", the node N 2 shifts to "H" and the node N 4 shifts to "H". With the node N 4 at "H", the refresh counter 6 counts up the refresh address RA (0:8). While the internal RAS re-enters the "H" state as the node N 1 is set to "L" to perform a refresh operation, the refresh address RA (0:8) is now at an address j+1 as a result of the count-up. Then, the refresh control circuit 5 sets the node N 1 to "H", the node N 2 to "L" and the node N 4 to "L". In response to the node N 1 shifting to "H", the internal RAS shifts to "L" to end a second refresh cycle. Subsequently, this process is repeated to sustain the refresh operation.

When the highest-order signal RA8 shifts from "L" to "H" as a result of counting up the refresh address RA (0:8) at a time point T4, the refresh block specification signal RB (1) set to "L" causes the node N 3 at the means for operation prohibition 30 to shift to "L", and the length of time over which the node N 3 remains at "L" is fixed to the length of time over which the internal RAS is sustained at "L". Thus, the RAS system circuit 11 does not engage in operation, and consequently, no refresh operation is performed. Since the means for clock route changing 40 provides the timing signal from the node N 1 to the refresh counter 6 even though the RAS system circuit 11 is not in an operating state, the refresh counter 6 does not stop the count-up.

When the signal RASB is set to "H" at a time point T5, the refresh enable signal SREF is set to "L", and the signal CASB is set to "H" when a period of time tCHS has elapsed, to exit the self refresh mode.

As described above, in the first embodiment, which is provided with two means for latching 20-1 and 20-2 that store the refresh block data RBDATA (0:1) for specifying the block ABLK1 or the block ABLK2 to undergo a self refresh, the means for operation prohibition 30 that compares the refresh block specification signals RB (0) and RB (1) with the refresh address signal RA8 to fix the internal RAS and the means for clock route changing 40, the RAS system circuit 11 is stopped as necessary in response to the refresh block data RBDATA (0:1) provided from the outside to allow only the desired block ABLK1 or ABLK2 to undergo the self refresh with the other block ABLK1 or ABLK2 not allowed to undergo a self refresh. Thus, lower power consumption is achieved in the DRAM.

(Second Embodiment)

Figure 6:
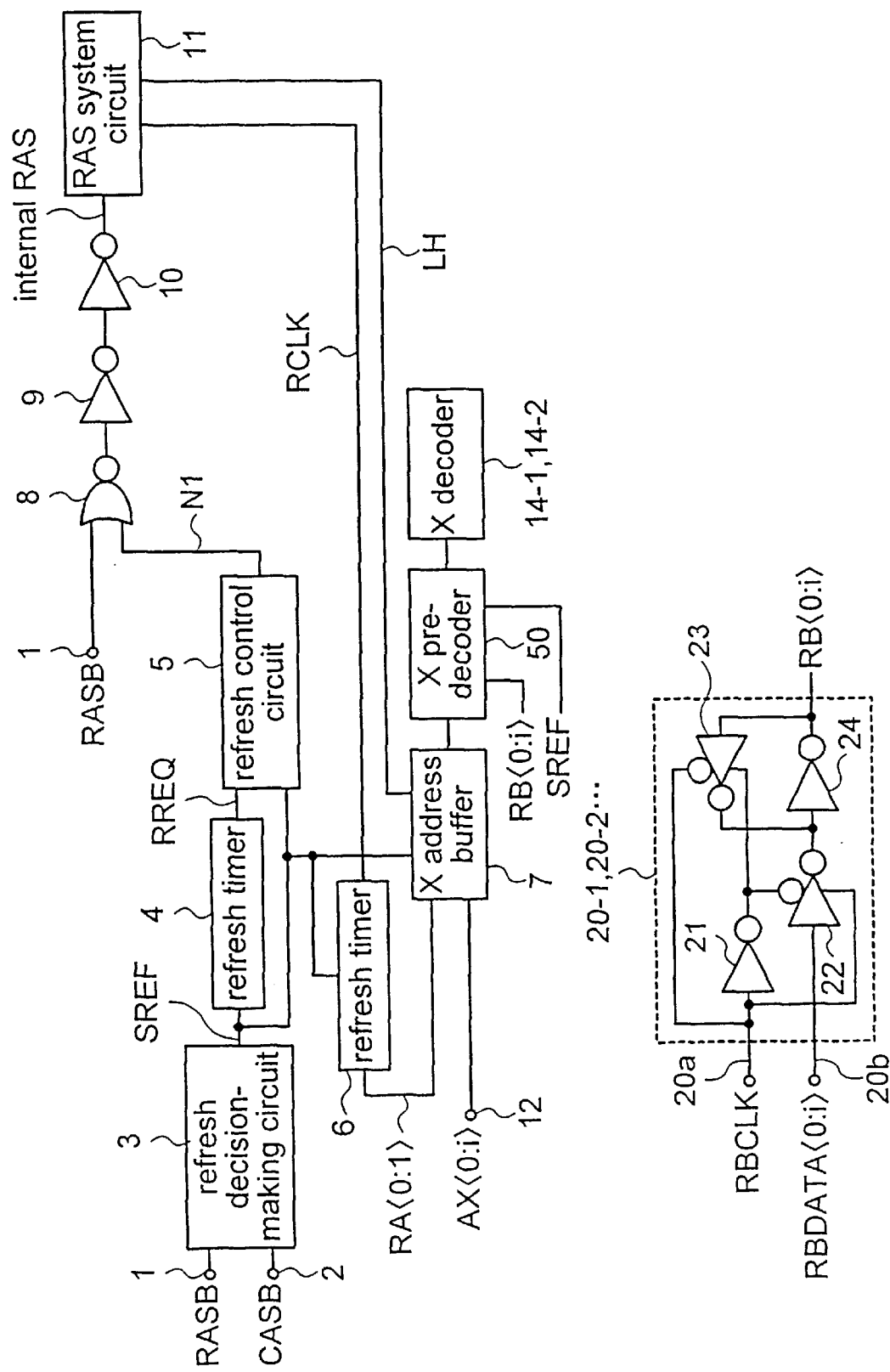
FIG. 6 is a block diagram of an essential portion of the DRAM in the second embodiment of the present invention.

FIG. 6 is a block diagram of an essential portion of the DRAM in the second embodiment of the present invention, with the same reference numbers assigned to elements identical to those in FIG. 2 illustrating the prior art and FIG. 1 illustrating the first embodiment.

This DRAM is achieved by providing the means for latching 20-1 and 20-2 employed in the first embodiment in the DRAM in the prior art and by replacing the X pre-decoder 13 in the prior art with an X pre-decoder 50 assuming a different structure.

Figure 7:
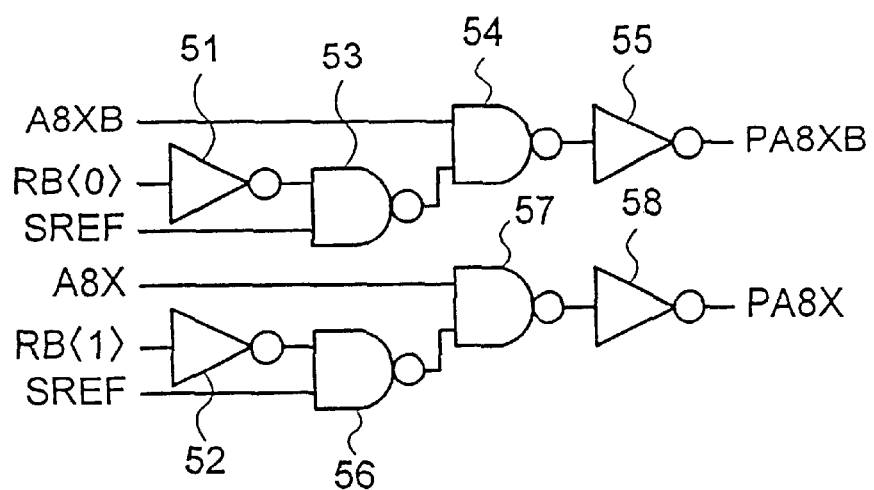
FIG. 7 is a block diagram of the X pre-decoder 50 in FIG. 6.

FIG. 7 is a block diagram of the X pre-decoder 50 in FIG. 6.

This X pre-decoder 50 receives the refresh block specification signals RB (0) and RB (1) from the means for latching 20-1 and 20-2, and is provided with an inverter 51 and an inverter 52 to which the signal RB (0) and the signal RB (1) are respectively input. The output terminal of the inverter 51 is connected to one of the input terminals of a two-input NAND gate 53. The refresh enable signal SREF is input from the refresh decision-making circuit 3 to the other input terminal of the NAND gate 53. The output terminal of the NAND gate 53 is connected to one of the input terminals of a two-input NAND gate 54. A highest-order bit signal A8XB in the address output by the X address buffer 7 is input to the other input terminal of the NAND gate 54. The output terminal of the NAND gate 54 is connected to the input terminal of an inverter 55 which outputs a pre-decode signal PA8XB.

The output terminal of the inverter 52 is connected to one of the input terminals of a two-input NAND gate 56. The refresh enable signal SREF is input from the refresh decision-making circuit 3 to the other input terminal of the NAND gate 56. The output terminal of the NAND gate 56 is connected to one of the input terminals of a two-input NAND gate 57. A highest-order bit signal A8X in the address output by the X address buffer 7 is input to the other input terminal of the NAND gate 57. The output terminal of the NAND gate 57 is connected to the input terminal of an inverter 58 which outputs a pre-decode signal PA8X.

In the X pre-decoder 50 structured as described above, the inverters the inverter 51 and 52 and the NAND gates 53, 54, 56 and 57 constitute a means for comparison. The X pre-decoder 50 pre-decodes the signals A8X and A8XB at the refresh address provided by the X address buffer 7 by comparing them with the refresh a block specification signals RB (0) and RB (1) and provides the pre-decode signals PA8X and PA8XB resulting from the decoding operation to the X decoders 14-1 and 14-2 via the inverters 55 and 58.

Figure 8:
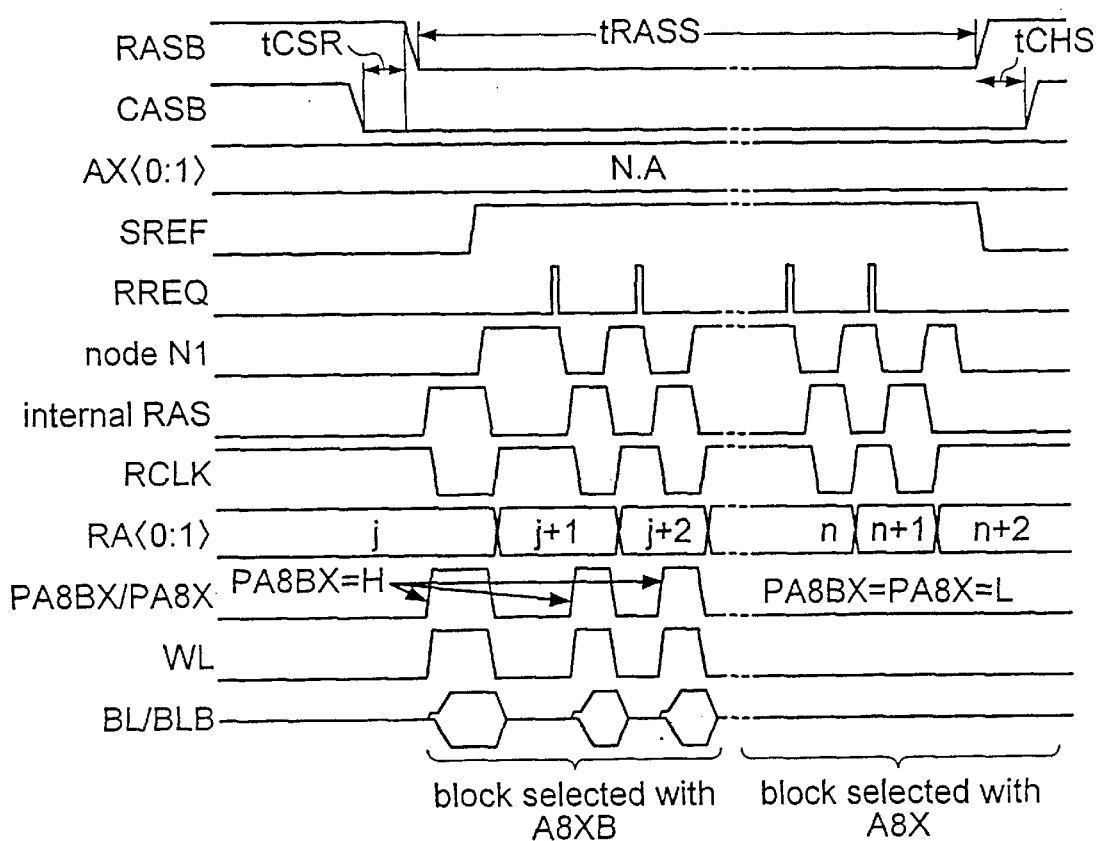
FIG. 8 is a waveform diagram corresponding to the operation achieved in the DRAM in FIG. 6.

FIG. 8 is a waveform diagram corresponding to the operation achieved in the DRAM shown in FIG. 6. Now, in reference to FIG. 8, the self refresh operation performed in the DRAM in FIG. 6 is explained.

Prior to the start of a self refresh operation, refresh block data RBDATA (0:1) for selecting the block ABLK1 or ABLK2 to undergo a refresh are provided to the pads 20b of the means for latching 20-1 and 20-2 and a one-pulse clock RBCLK is input through the pads 20a. In response, the means for latching 20-1 and 20-2 latch the refresh block data RBDATA (0:1) as a refresh block specification signal RB (0:1). The explanation is given here on the assumption that the latched signals RB (0) and RB (1) respectively indicate "H" and "L", as in the explanation given in the first embodiment.

Since the operation performed in this DRAM is similar to that achieved in the first embodiment, only the difference is explained below. In the first embodiment, the signal RA8 at the refresh address output by the refresh counter 6 is compared with the signals RB (0) and RB (1) by the means for operation prohibition 30, and the internal RAS is fixed at "L" in conformance to the results of the comparison to prohibit operation of the RAS system circuit 11. In the second embodiment, however, the signals A8X and A8XB at the refresh address output by the X address buffer 7 are compared with the signals RB (0) and RB (1) by the X pre-decoder 50, and the pre-decode signals PA8X and PA8XB output by the X pre-decoder 50 are set to "L" to prohibit operation at the word lines WL and a sense latch operation executed by the X decoders 14-1 and 14-2.

Since this prohibits a series of operations including the drive of the word lines WL and the sense latch operation at the memory cell array, which consume the greatest amount of electrical current during the refresh operation, a reduction in power consumption is achieved.

As explained above, the second embodiment, achieved by providing the two means for latching 20-1 and 20-2 for storing the refresh block data RBDATA (0:1) and the X pre-decoder 50 assuming a different structure is the DRAM in the prior art shown in FIG. 2, realizes a reduction in power consumption compared to the DRAM in the prior art, since only a desire block ABLK 1 or ABLK2 undergoes a self refresh, and a self refresh is not implemented for the other block ABLK2 or ABLK 1 as in the first embodiment. Furthermore, the second embodiment is achieved by making only a minimal modification on the circuits in the prior art shown in FIG. 2.

(Third Embodiment)

Figure 9:
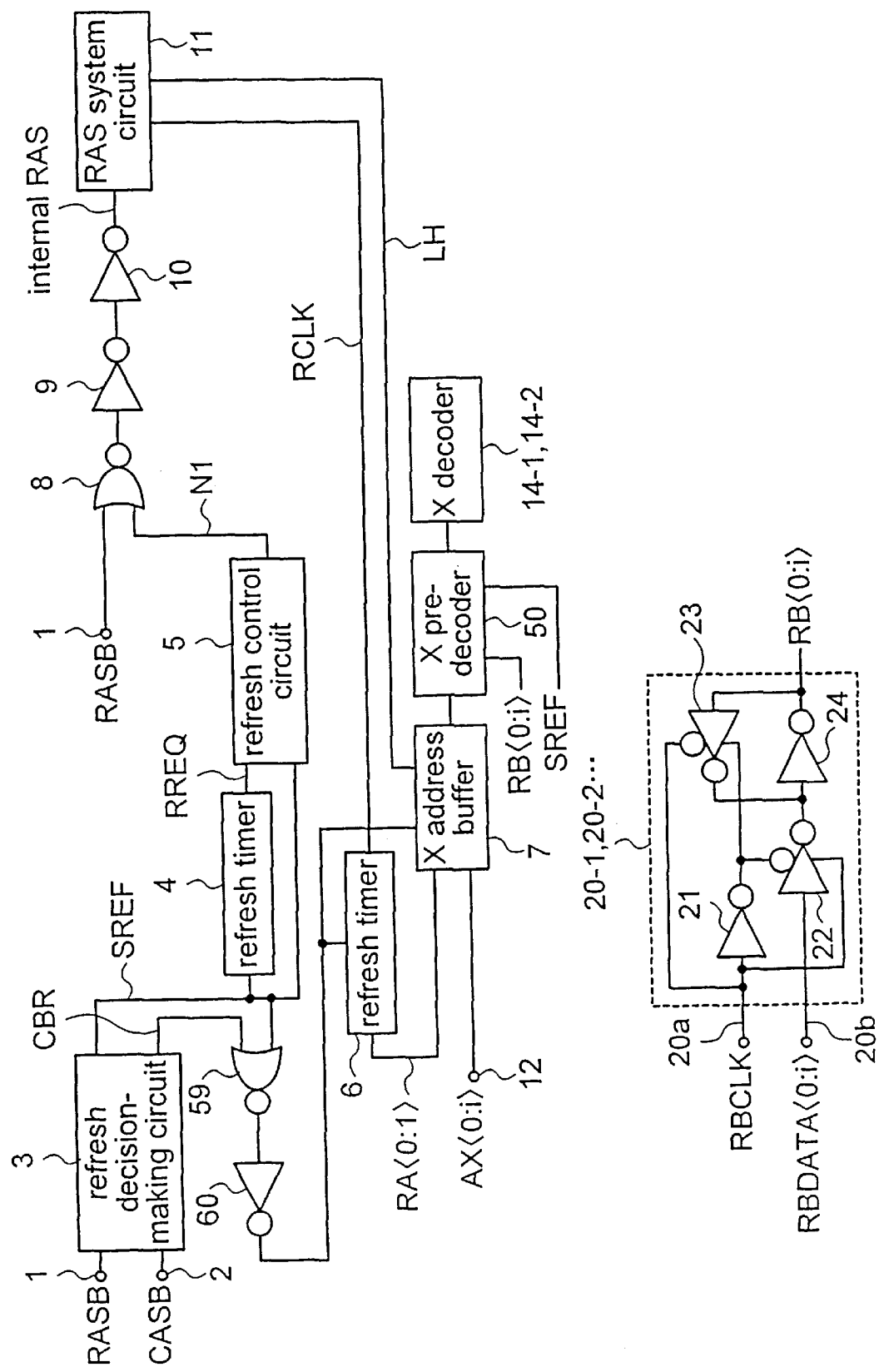
FIG. 9 is a block diagram of an essential portion of the DRAM in a third embodiment of the present invention.

FIG. 9 is a block diagram of an essential portion of the DRAM in the third embodiment of the present invention, with the same reference numbers assigned to elements identical to those in FIG. 6 illustrating the second embodiment.

While the self refresh operation is explained in reference to the first and second embodiments, a DRAM constituted by providing the X pre-decoder 50 in addition to the means for latching 20-1 and 20-2 as in the second embodiment also achieves a reduction in power consumption when performing a CBR (CAS before RAS) refresh.

The DRAM in the third embodiment is achieved by adding a circuit for setting a CBR refresh to the circuit structure shown in FIG. 6. A means for counter activation provided to set a CBR refresh in the DRAM comprises a two-input NOR gate 59 to which the self refresh enable signal SREF and a CBR refresh enable signal CBR both output by the refresh decision-making circuit 3 are input and an inverter 60 connected to the output terminal of the NOR gate 59. The output terminal of the inverter 60 which outputs an activation signal is connected to the refresh counter 6 and the X address buffer 7.

By connecting the NOR gate 59 and the inverter 60 in this manner, the refresh counter 6 engages in an operation when the refresh decision-making circuit 3 detects a self refresh and sets the self refresh enable signal SREF to "H" or when it detects a CBR refresh and sets the CBR refresh enable signal to "H", and an operation of the refresh counter 6 is prohibited when the signals SREF and CBR are both at "L".

Figure 10:
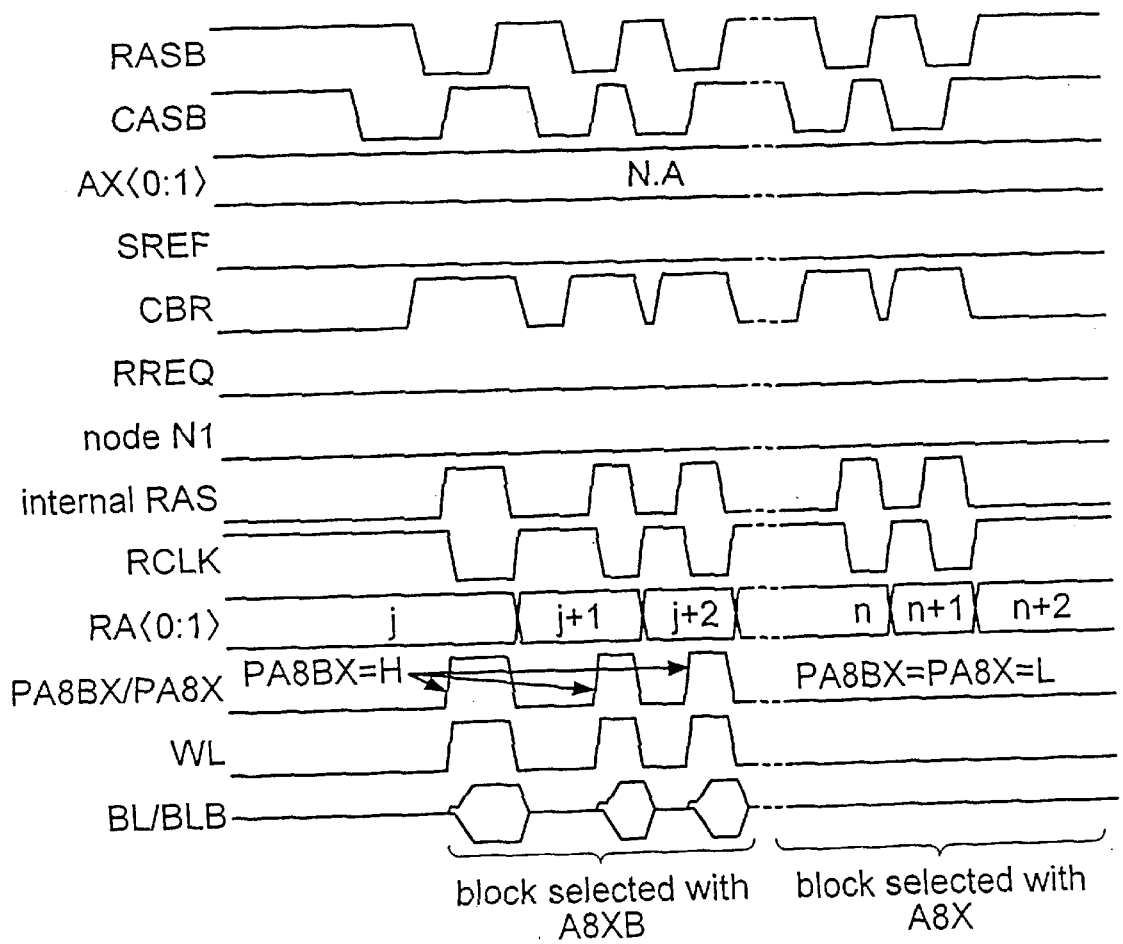
FIG. 10 is a waveform diagram corresponding to the operation achieved in the DRAM in FIG. 9.

FIG. 10 is a waveform diagram corresponding to the operation performed in the DRAM in FIG. 9. A CBR refresh operation performed in the DRAM in FIG. 9 is explained in reference to FIG. 10.

When the signal RASB falls after a fall of the signal CASB, the refresh decision-making circuit 3 sets the signal CBR to "H". Thus, the refresh counter 6 starts an operation. Since the signal CASB shifts to "H" within a specific length of time during a CBR refresh, the refresh decision-making circuit 3 does not set the self refresh enable signal SREF to "H". As a result, while the internal RAS is set to "H" with the refresh request signal RREQ functioning as a trigger in the second embodiment, the internal RAS in the CBR refresh shifts in synchronization with the signal RASB. Other basic operations are performed in a similar manner to that in the second embodiment.

As explained above, the third embodiment, in which the refresh decision-making circuit 3 detects a CBR refresh, achieves a reduction in the power consumption in the CBR refresh simply by providing the two means for latching 20-1 and 20-2 and replacing the X pre-decoder 13 with the X pre-decoder 50 assuming a different structure.

(Fourth Embodiment)

Figure 11:
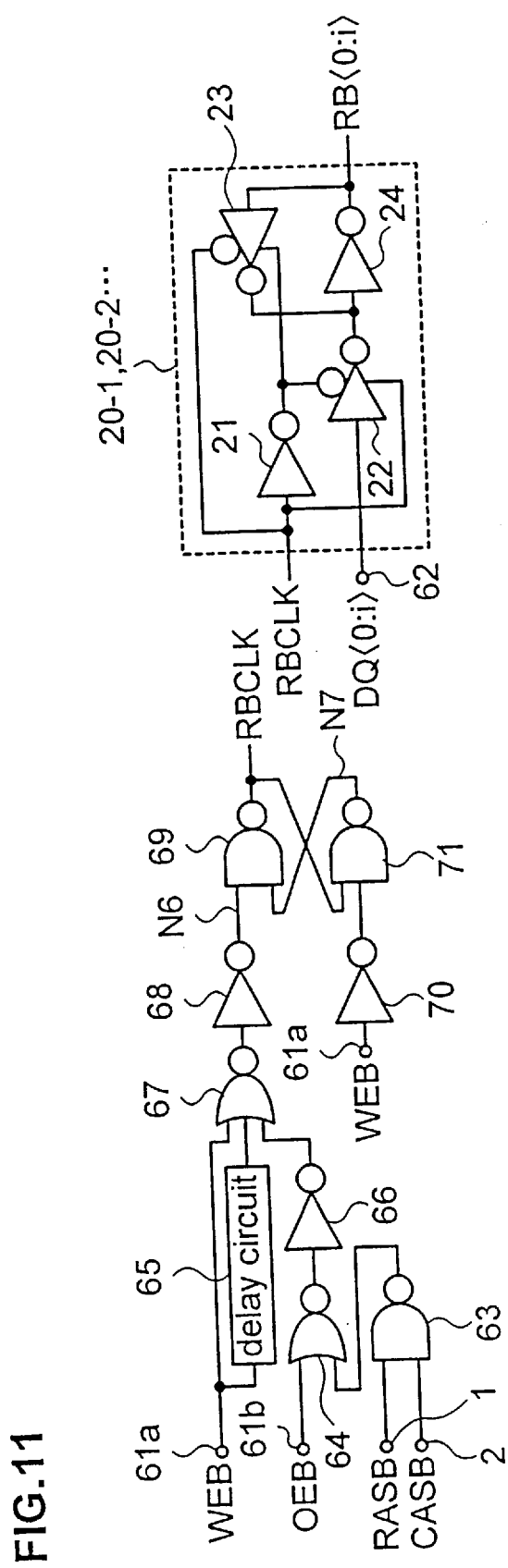
FIG. 11 illustrates the structure around the pads in a fourth embodiment of the present invention.

FIG. 11 illustrates the structure of the DRAM in the fourth embodiment of the present invention in an area around the pads.

In the first~third embodiments, the input pads 20a and 20b are provided to induce the refresh block data RBDATA (0:1) for specifying a block to undergo a refresh and the external clock RBCLK into the chip. In the fourth embodiment, a WEB pad 61a through which a write enable signal WEB is input, an OEB pad 61b through which a read enable signal OEB is input and DQ (0:i) pads 62 through which access data are input/output are utilized to provide refresh block data RBDATA (0:i) and the external clock RBCLK.

In order to effectively utilize the pads, a two-input NAND gate 63 having one input terminal thereof connected to the signal RASB pad 1 and the other input terminal thereof connected to the signal CASB pad 2, a two-input NOR gate 64 having one input terminal thereof connected to the OEB pad 61b and a delay circuit 65 constituted of inverters and the like provided over an odd number of stages and connected to the WEB pad 61a are provided. The output terminal of the NAND gate 63 is connected to the other input terminal of the NOR gate 64. The output terminal of the NOR gate 64 is connected to one of the input terminals of a three-input NOR gate 67 via an inverter 66. The two remaining input terminals of the three-input NOR gate 67 are connected with the WEB pad 61a and the output side of the delay circuit 65.

The output terminal of the NOR gate 67 is connected to the input terminal of an inverter 68, with a node N 6 on the output terminal side of the inverter 68 connected to one of the input terminals of a two-input NAND gate 69. In addition, the WEB pad 61a is connected to one of the input terminals of a two-input NAND gate 71 via an inverter 70. A node N 7 on the output terminal side of the NAND gate 71 is connected to the other input terminal of the two-input NAND gate 69, with the output terminal for clock RBCLK output of the NAND gate 69 connected to the other input terminal of the NAND gate 71.

The NAND gate 63 connected to the pads 1 and 2 through the NAND gate 71 have a function of generating a one-shot pulse clock RBCLK, with the output terminal of the NAND gate 69 connected to the input terminals of the inverters 21 at the means for latching 20-1, 20-2, . . . The input terminals of the clocked inverters 22 at the means for latching 20-1, 20-2, . . . are connected to the DQ (0:i) pads 62.

Figure 12:
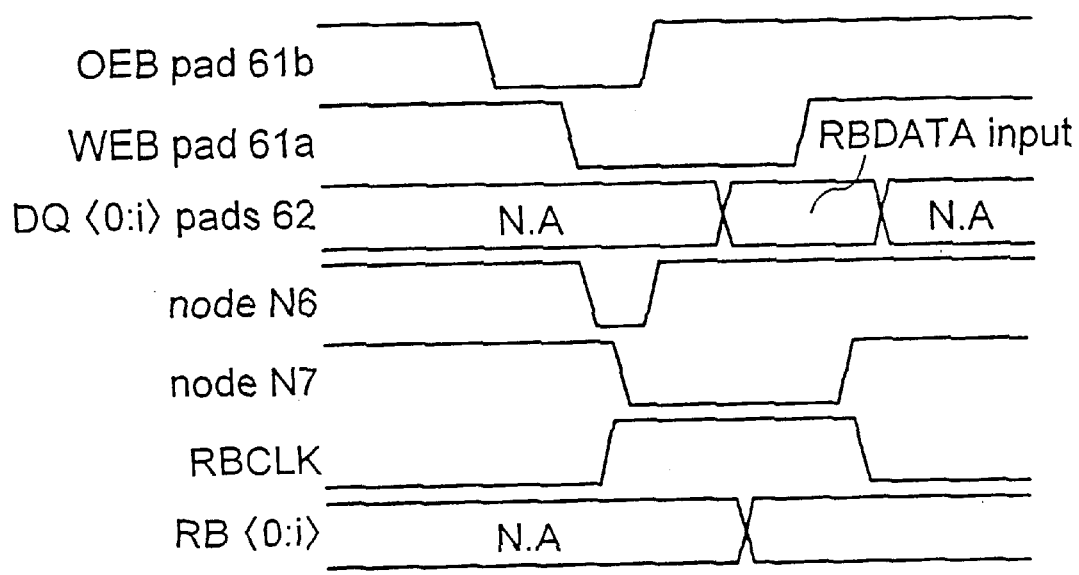
FIG. 12 is a waveform diagram corresponding to the operation achieved in FIG. 11.

FIG. 12 is a waveform diagram corresponding to the operation achieved in the vicinity of the pads shown in FIG. 11. The operation performed in the structure illustrated in FIG. 11 is explained in reference to FIG. 12.

Since with the levels of the WEB pad 61a and the OEB pad 61b may be either at "H" or at "L" as long as a the signal RASB and the signal CASB are both at "H" in a normal DRAM, the timing is defined by using the WEB pad 61a and the OEB pad 61b in this state to generate the clock RBCLK.

Namely, by setting the OEB pad 61b from "H" to "L" when the setup time has elapsed before the WEB pad 61a shifts from "H" to "L" while the signal RASB pad 1 and the signal CASB pad 2 are both at "H", the delay circuit 65 sets all the inputs of the three-input NOR gate 67 to "L" resulting in a one-shot pulse at "L" manifesting at the node N 6. When the node N 6 is set to "L", the clock RBCLK shifts to "H". With the clock RBCLK at "H" the node N 7 is set to "L" and the clock RBCLK remains fixed at "H" until the node N 7 shifts to "H". With the WEB pad 61a at "H" by inputting the refresh block data RBDATA to the DQ (0:i) pads 62 when the setup time has elapsed before the WEB pad 61a is set from "L" to "H", the node N 7 is shifted from "L" to "H". When the node N 7 is set to "H", the clock RBCLK shifts from "H" to "L", and the means for latching 20-1, 20-2, . . . latch the data RBDATA.

As explained above, in the fourth embodiment, in which the refresh block data RBDATA are input through the DQ (0:i) pads 62 and the clock RBCLK is generated inside the chip by utilizing the WEB pad 61a and the OEB pad 61b, it is not necessary to increase the number of input pins and, thus, pin compatibility with a DRAM in the prior art is achieved.

(Fifth Embodiment)

Figure 13:
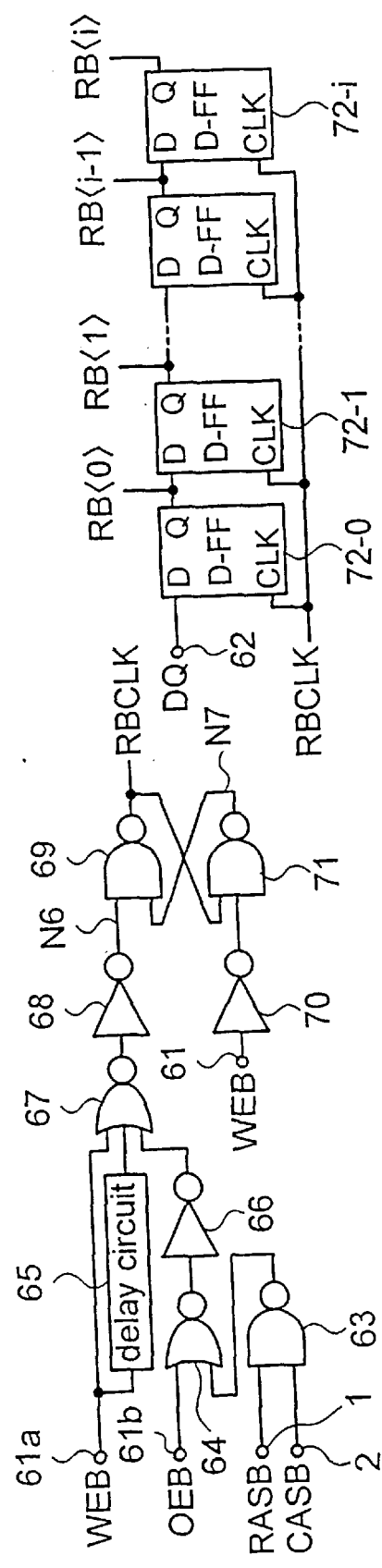
FIG. 13 illustrates the structure around the pads in a fifth embodiment of the present invention.

FIG. 13 illustrates the structure of the DRAM in the fifth embodiment of the present invention in the area around the pads, with the same reference numbers assigned to elements identical to those in FIG. 11 illustrating the fourth embodiment.

While the number of DQ (0:1) pads 62 in the fourth embodiment must correspond with the number of means for latching 20-1, 20-2, . . . , there are situations in which only one, for instance, DQ pad 62 can be provided in the DRAM. In such a situation, a shift register may be formed by connecting in cascade a plurality of the delay-type flip-flops 72-0~72-i over a plurality of stages, as illustrated in FIG. 13.

Figure 14:
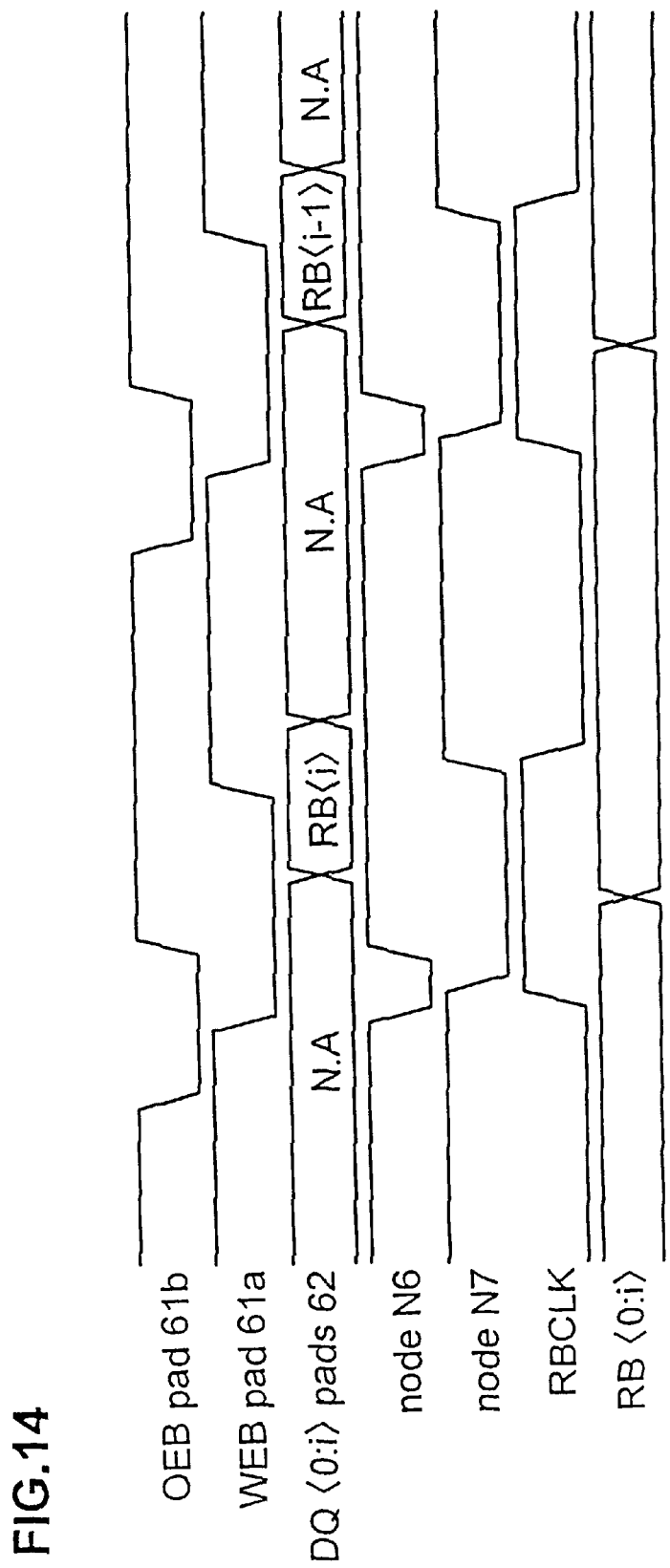
FIG. 14 is a waveform diagram corresponding to the operation achieved in FIG. 13.

FIG. 14 is a waveform diagram illustrating the operation achieved in the structure shown in FIG. 13.

With the WEB pad 61a and the OEB pad 61b repeating the cycle shown in FIG. 12 illustrating the operation achieved in the fourth embodiment, a clock RBCLK is generated over a plurality of times, the refresh block data RBDATA are sequentially taken in through the single DQ pad 62 to be stored in the shift register constituted of the plurality of flip-flops 72-0~72-i. The data RBDATA are output in parallel through the individual flip-flops 72-0~72-i to be provided to the plurality of means for latching 20-1, 20-2, . . .

As explained above, in the fifth embodiment, in which a shift register is formed by providing the flip-flops 72-0~72-i connected in cascade over a plurality of stages to the DQ pad 62, only one DQ pad 62 is required to input the refresh block data RBDATA and, consequently, it is not necessary to increase the number of pins even when the number of blocks ABLK 1, ABLK 2, . . . to be selected is large resulting in an increase in the number of means for latching 20-1, 20-2, . . .

(Sixth Embodiment)

Figure 15:
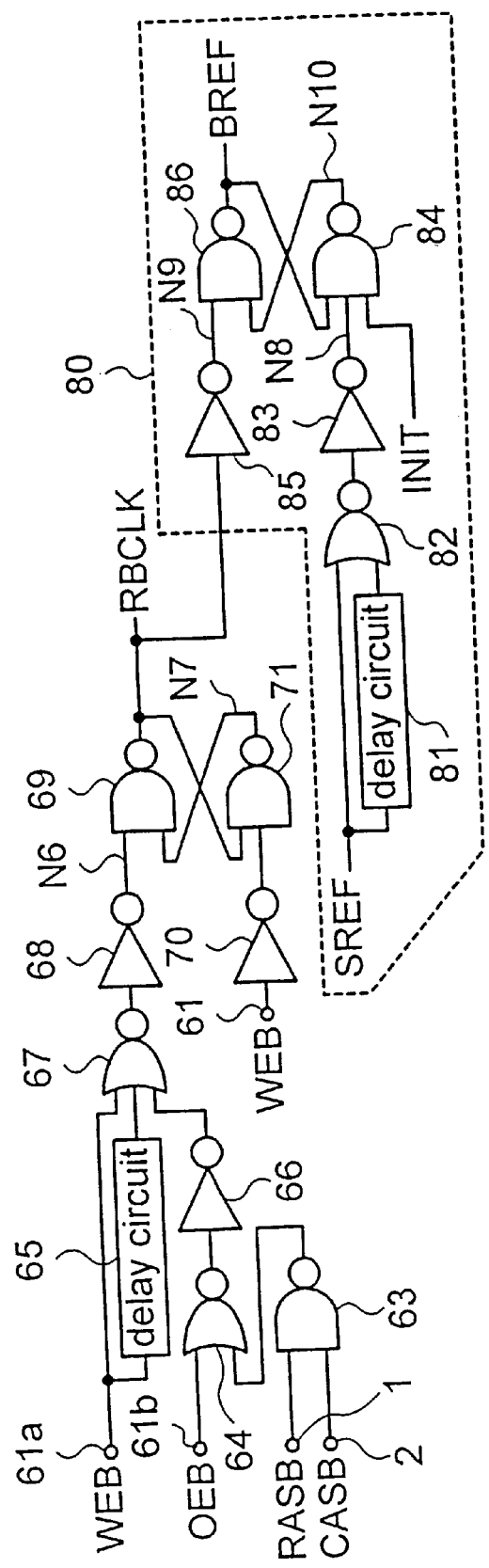
FIG. 15 is a block diagram of an essential portion of the DRAM in a sixth embodiment of the present invention.

FIG. 15 is a block diagram of an essential portion of the DRAM in the refresh counter 6th embodiment of the present invention, with the same reference numbers assigned to elements identical to those in FIG. 13 illustrating the fifth embodiment.

It is assumed in the first~fifth embodiments that the refresh block data RBDATA are always input before the DRAM enters the self refresh mode. Thus, even when performing a self refresh similar to that performed in the prior art, in which all the blocks ABLK 1, ABLK 2, . . . are refreshed, too, the refresh block data RBDATA must be input. In contrast, in the DRAM in the refresh counter 6th embodiment, a means for refresh mode setting 80 is provided in, for instance, the circuit for generating the clock RBCLK constituted of the NAND gate 63~NAND gate 71 in the fourth embodiment to input an output signal BREF from the means for refresh mode setting 80 to the X pre-decoder 50 in FIG. 6 instead of the refresh enable signal SREF. Other structural features are identical to those in FIG. 6.

The means for refresh mode setting 80 is provided with a delay circuit 81 constituted of inverters provided over an odd number of stages for delaying the refresh enable signal SREF, and one of the input terminals of the two-input NOR gate 82 is connected to the output side of the delay circuit 81. The signal SREF is input to the other input terminal of the NOR gate 82. The output terminal of the NOR gate 82 is connected to the input terminal of an inverter 83, and a node N 8 on the output terminal side of the inverter 83 is connected to one of the input terminals of a three-input NAND gate 84. The refresh mode setting circuit 80 is further provided with an inverter 85 to which the clock RBCLK output by the NAND gate 69 is input. A node N 9 on the output terminal side of the inverter 85 is connected to one of the input terminals of a two-input NAND gate 86. A node N 10 on the output terminal side of the NAND gate 84 is connected to the other input terminal of the NAND gate 86. The remaining input terminal of the NAND gate 84 is connected with the output terminal for signal BREF output at the NAND gate 86 and also a signal INIT is input to the remaining input terminal of the NAND gate 84. The output terminal of the NAND gate 86 is connected to the input terminals of the NAND gates 53 and 56 at the X pre-decoder 50 shown in FIG. 7.

Figure 16:
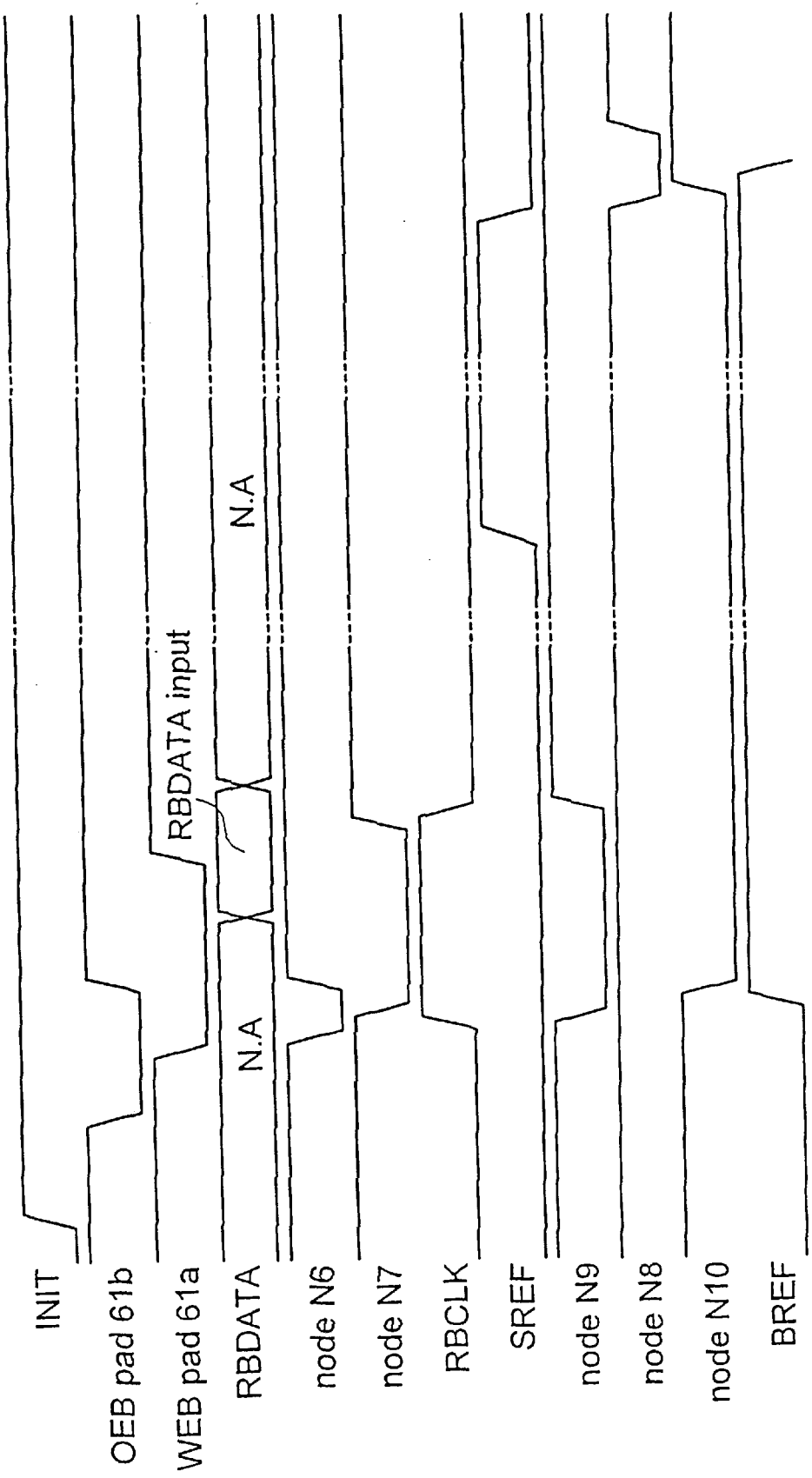
FIG. 16 is a waveform diagram corresponding to the operation achieved in the DRAM in FIG. 15.

In reference to FIG. 16 which presents a waveform diagram corresponding to the operation achieved in the DRAM in FIG. 15, the operation performed in the DRAM in FIG. 15 is explained.

An explanation of the operation performed up to the point at which the clock RBCLK shifts from "L" to "H", which is similar to that performed in the fourth embodiment, is omitted. With the signal INIT set at "H", the node N 9 is set to "L" as the clock RBCLK shifts from "L" to "H", and the output signal BREF from the NAND gate 86 is set to "H". When the signal BREF is set to "H", the node N 10 shifts to "L" and, subsequently, the signal BREF is sustained at "H". The cycle for setting the refresh block data RBDATA ends at this point, and the DRAM enters the self refresh mode. While the refresh enable signal SREF shifts from "L" to "H" as the DRAM enters the self refresh mode, the node N 8 remains at "H". When the DRAM exits the self refresh mode after the self refresh, the signal SREF shifts from "H" to "L". With the signal SREF set to "L", a one-shot pulse which sets the node N 8 from "H" to "L" and then to "H" manifests to shift the node N 10 from "L" to "H" and the signal BREF from "H" to "L".

As explained above, in the refresh counter 6th embodiment provided with the means for refresh mode setting 80, the signal BREF provided to the X pre-decoder 50 can be set to "H" if a cycle for setting a block to undergo a refresh is implemented and the signal BREF can be set to "L" otherwise, thereby enabling selection between the self refresh in the prior art and the self refresh in which block selection is performed. Thus, compatibility with a DRAM having the refresh function of the prior art is achieved.

(Seventh Embodiment)

Figure 17:
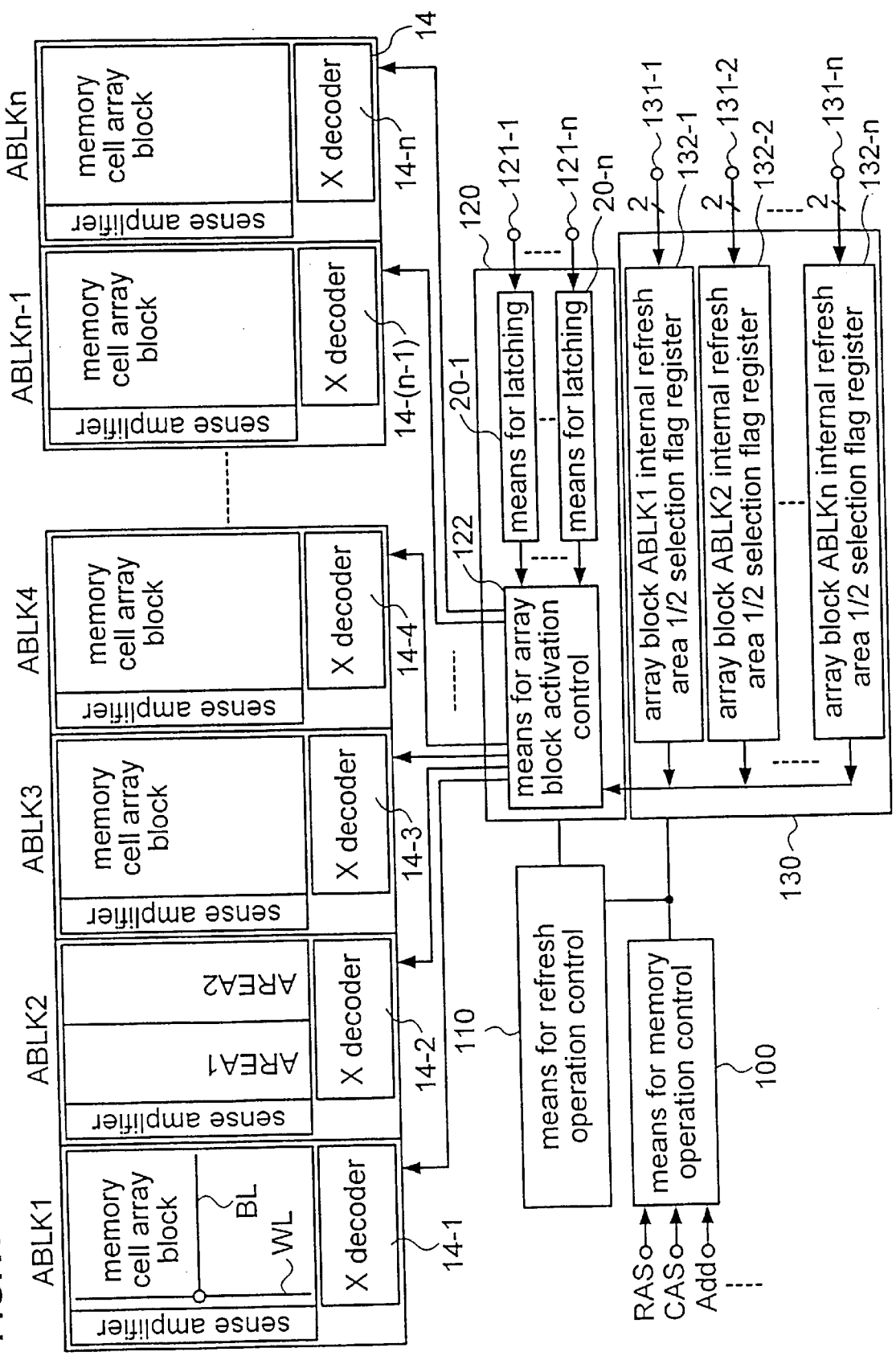
FIG. 17 is a block diagram of the DRAM in a seventh embodiment of the present invention.

FIG. 17 is a block diagram of the DRAM in the seventh embodiment of the present invention.

In the first~sixth embodiments, a decision as to whether or not a refresh is to be performed is made based upon the refresh block data RBDATA for the individual blocks ABLK 1~ABLK n in the memory cell array to reduce the power consumption. In the seventh embodiment, the blocks ABLK 1~ABLK n are each divided into smaller units, e.g., two areas; AREA 1 and AREA 2, and the decision as to whether or not a refresh is to be performed is made for the individual areas.

The DRAM is provided with a plurality of blocks ABLK 1~ABLK n at the memory cell array, X decoders 14-1~14-n provided in correspondence to the individual blocks ABLK 1~ABLK n, a means for memory operation control 100, a means for refresh operation control 110, a means for refresh block selection 120 and a means for block internal refresh area selection 130. The means for memory operation control 100 is constituted of the refresh decision-making circuit 3 shown in FIG. 1. The means for refresh operation control 110 is constituted of the refresh timer 4, the refresh control circuit 5, the RAS system circuit 11 and the like shown in FIG. 1.

The means for refresh block selection 120 is provided with the plurality of means for latching 20-1~20-n in FIG. 1 and a means for array block activation control connected to the means for latching. The plurality of means for latching 20-1~20-n latch refresh block data input through respective input pads 121-1~121-n and provide the latched data to the means for array block activation control 122. The means for array block activation control 122 is constituted of a circuit roughly identical to the means for operation prohibition 30 in FIG. 1 or the X pre-decoder 50 in FIG. 6. In other words, the means for array block activation control 122 assumes a structure achieved by enabling the means for operation prohibition 30 in FIG. 1 to implement refresh control on the bits of the refresh address RA corresponding to the areas AREA 1 and AREA 2 or a structure achieved by allowing the X pre-decoder 50 in FIG. 6 to implement refresh control on the bits of the refresh addresses RA corresponding to the areas AREA 1 and AREA 2.

The means for block internal refresh area selection 130 is constituted of a plurality of refresh area 1/2 selection flag registers 132-1~132-n corresponding to the refresh areas within the individual blocks ABLK 1~ABLK n respectively connected to a plurality of input pads 131-1~131-n. Selection signals RFLG 1~RFLG n are input in units of 2 bits to the flag registers 132-1~132-n via the input pads 131-1~131-n respectively for storage.

There are four different states that may manifest with regard to selection of the areas AREA 1 and AREA 2 in each of the blocks ABLK 1~ABLK n. The lower-order one bit in each of the selection signals RFLG 1~RFLG n indicates whether or not the area AREA 1 needs to be refreshed, whereas the higher order one bit in each selection signal indicates whether or not the area AREA 2 needs to be refreshed. The selection signals RFLG 1~RFLG n output by the plurality of refresh area 1/2 selection flag registers 132-1~132-n are provided to the means for array block activation control 122.

Next, the operation achieved in the DRAM shown in FIG. 17 is explained.

Prior to the start of a self refresh operation, refresh block data RBDATA indicating a block ABLK 1~ABLK n to undergo a refresh are latched by the means for latching 20-1~20-n, and the selection signals RFLG 1~RFLG n providing the information on area AREA 1/AREA 2 selection are respectively stored in the refresh area 1/2 selection flag registers 132-1~132-n. When a refresh request is issued, in conformance to the control implemented by the means for refresh operation control 110, the means for array block activation control 122 makes a decision based upon the state of the selection signal (e.g., RFLG2) as to whether or not the current refresh address RA corresponds to the area (e.g., AREA 1) to undergo a refresh in the block (e.g., ABLK 2) to be activated by the refresh block data RBDATA. If the refresh address RA corresponds to the area at to undergo the refresh, the means for array block activation control 122 provides an enable signal set to "H" to the corresponding block ABLK 2 to activate it. If it does not correspond to the area to undergo the refresh, the means for array block activation control 122 sets the enable signal to "L", to deactivate the block ABLK 2. The refresh is performed when the block ABLK 2 is activated, whereas a refresh is skipped if the block ABLK 2 is deactivated.

As explained above, in the seventh embodiment assuming a structure provided with the means for block internal refresh area selection 130 to enable selection of the area AREA 1 or AREA 2 for a refresh in each of the blocks ABLK 1~ABLK n, an area that is not to undergo a refresh can be set within a block that is to undergo a refresh. Thus, the degree of freedom in setting a refresh area is improved, to achieve a further reduction in unnecessary power consumption during a refresh operation.

(Eighth Embodiment)

Figure 18:
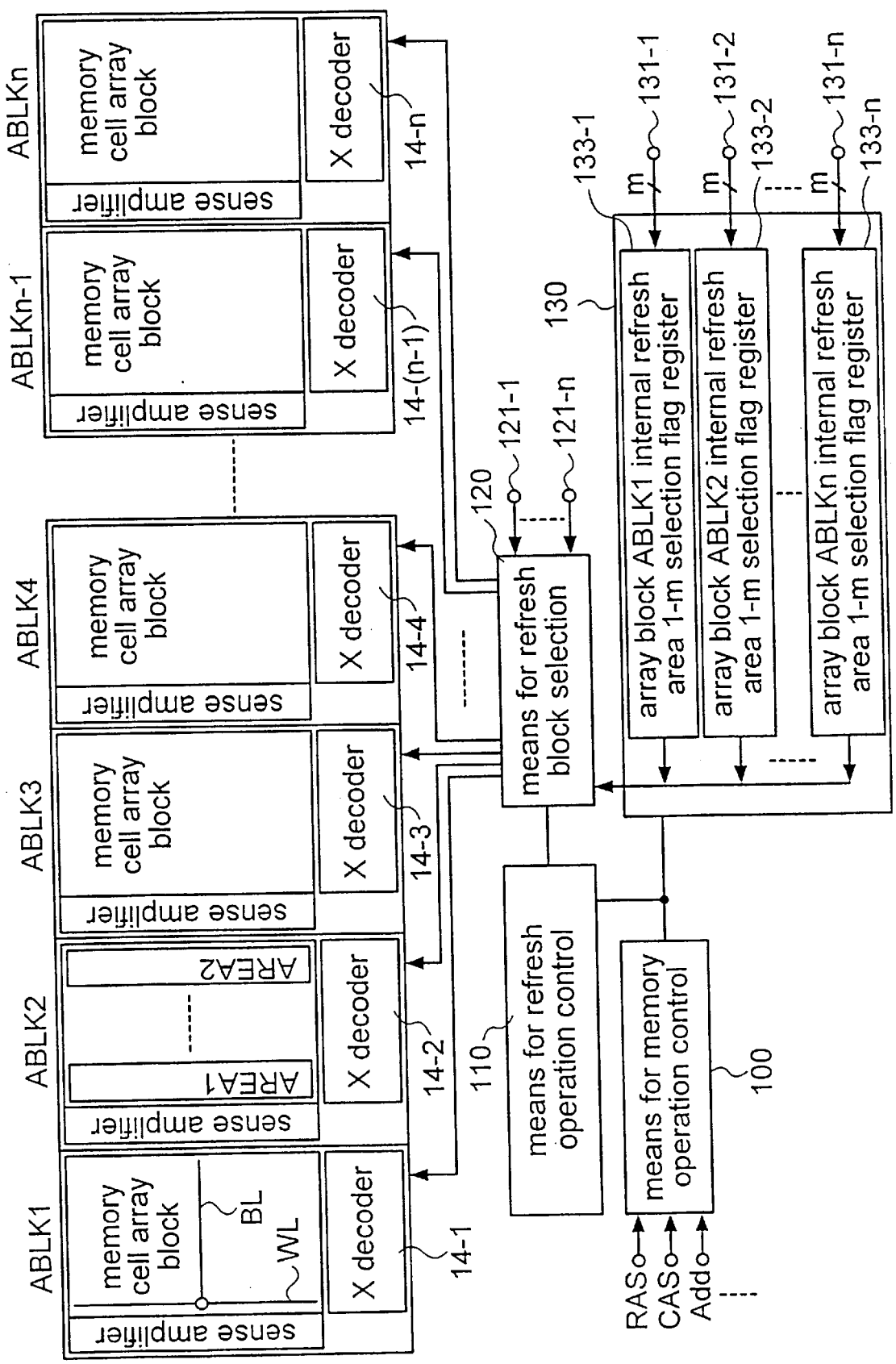
FIG. 18 is a block diagram of the DRAM in an eighth embodiment of the present invention.

FIG. 18 is a block diagram of the DRAM in the eighth embodiment of the present invention, with the same reference numbers assigned to elements identical to those in FIG. 17 illustrating the seventh embodiment.

The seventh embodiment assumes a structure which enables refresh control on the two areas AREA 1 and AREA 2 achieved by dividing each of the blocks ABLK 1~ABLK n at the memory cell array in half. In the DRAM in the eighth embodiment, the blocks ABLK 1~ABLK n are each divided into m areas AREA 1~AREA m for refresh control.

The means for block internal refresh area selection 130 at this DRAM is provided with refresh area 1-m selection flag registers 133-1~133-n corresponding to the individual blocks ABLK 1~ABLK n, which are respectively connected with input pads 131-1~131-n. m-bit width selection signals rFLG 1~rFLG n are provided through the input pads 131-1~131-n respectively. The m-bit width selection signals rFLG 1~rFLG n indicate whether or not the areas AREA 1~AREA m in the corresponding blocks need to be refreshed. Other structural features are similar to those in the seventh embodiment.

Next, the operation achieved in the DRAM in FIG. 18 is explained.

Prior to the start of a self refresh operation, the refresh block data RBDATA provided to select a refresh block are latched by the means for latching 20-1~20-n inside the means for refresh block selection 120. In addition, the selection signals rFLG 1~rFLG n indicating whether or not the areas inside the blocks ABLK 1~ABLK n need to be refreshed are stored at the refresh area 1-m selection flag registers 133-1~133-n.

These signals are held by the means for latching 20-1~20-n and the registers 133-1~133-n during the refresh operation. The subsequent operation is similar to that performed in the seventh embodiment.

As explained above, in the eighth embodiment assuming a structure which allows selection of the areas AREA 1~AREA m within each of the blocks ABLK 1~ABLK n for a refresh, areas that are not to undergo a refresh can be set in even smaller units within a block to undergo a refresh. Thus, a further improvement is achieved in the degree of freedom in setting refresh areas to achieve a greater reduction in unnecessary power consumption during refresh operations.

(Ninth Embodiment)

Figure 19:
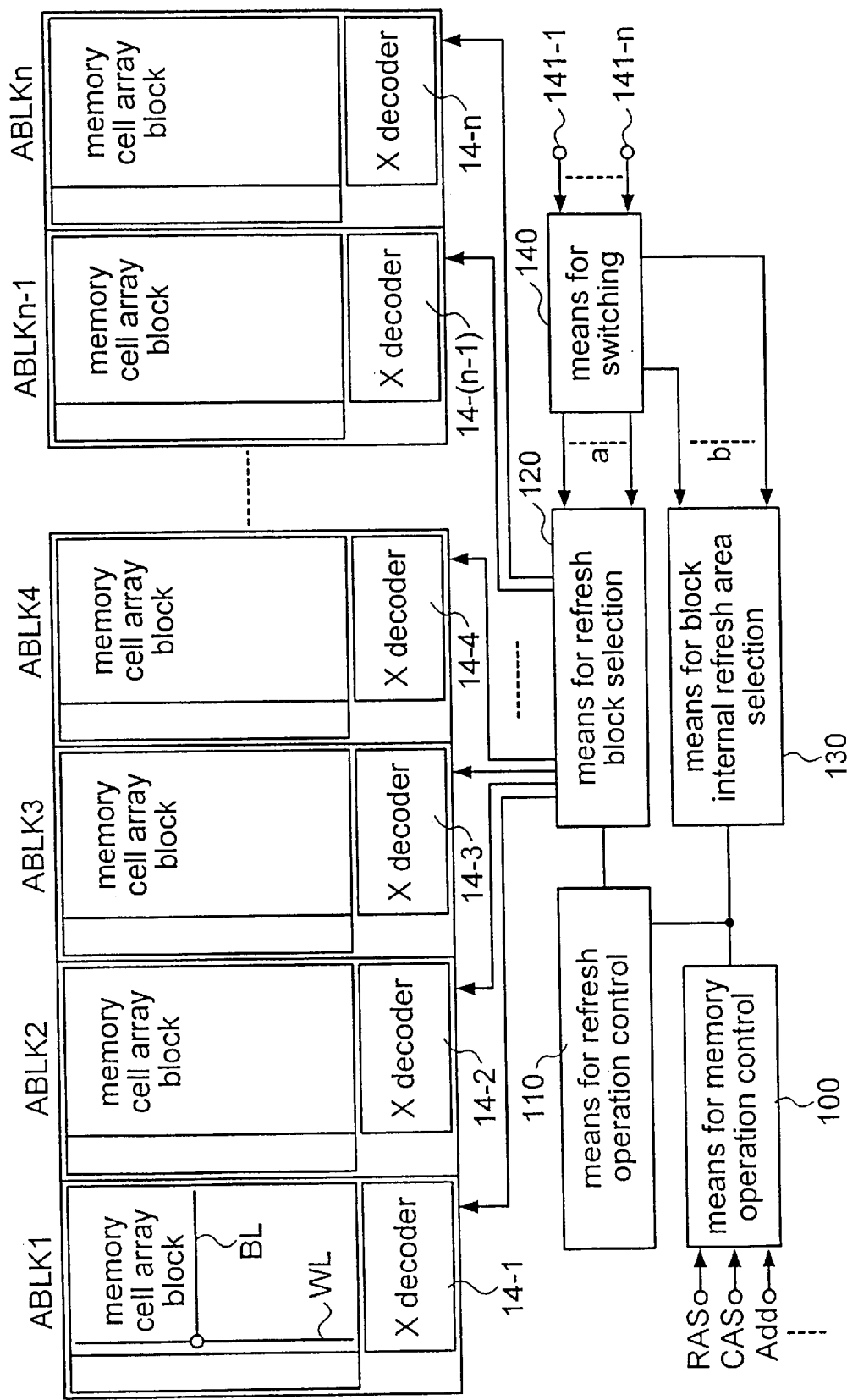
FIG. 19 is a block diagram of the DRAM in a ninth embodiment of the present invention.

FIG. 19 is a block diagram of the DRAM in the ninth embodiment of the present invention.

This DRAM is achieved by providing a means for switching 140 in the DRAM in FIG. 17 or FIG. 18 illustrating the seventh or eighth embodiment to input refresh block data RBDATA indicating whether or not the blocks ABLK 1~ABLK n need to be refreshed and selection signals RFLG 1~RFLG n (or rFLG 1~rFLG n) indicating refresh areas AREA within the individual blocks ABLK 1~ABLK n through a plurality of common input pads 141-1~141-n, and otherwise assumes structural features identical to those in the eighth embodiment. The means for switching 140 detects whether the signals input through the input pads 141-1~141-n are the refresh block data RBDATA or the selection signals RFLG 1~RFLG n or (rFLG 1~rFLG n), and if the results of this detection indicate the refresh block data, it outputs the refresh block data through its output terminal "a" provide them to the means for refresh block selection 120, whereas if the results of the detection indicate the selection signals RFLG 1~RFLG n (or rFLG 1~rFLG n), it switches the output terminal from the "a" side to the "b" side to provide the selection signals RFLG 1~RFLG n (or rFLG 1~rFLG n) to the means for block internal refresh area selection 130 by outputting them through the output terminal "b".

Next, the operation performed in the DRAM in FIG. 19 is explained.

Prior to the start of a refresh operation, the refresh block data RBDATA indicating whether not the blocks ABLK 1~ABLK n need to be refreshed are input through the input pads 141-1~141-n. Next, the selection signals RFLG 1~RFLG n (or rFLG 1~rFLG n) indicating refresh areas AREA within the individual blocks ABLK 1~ABLK n are input through the input pads 141-1~141-n. When the refresh block data RBDATA are input, the means for switching 140 outputs them through the output terminal "a" to provide them to the means for refresh block selection 120. When the selection signals RFLG 1~RFLG n (or rFLG 1~rFLG n) are input, it outputs them through the output terminal "b" to provide them to the means for block internal refresh area selection 130. The subsequent operation is identical to that performed in the seventh and eighth embodiments.

As explained above, the ninth embodiment, assuming a structure achieved by providing the means for switching 140 in the DRAM in the seventh or eighth embodiment to input the refresh block data RBDATA and the selection signals RFLG 1~RFLG n (or rFLG 1~rFLG n) through the common input pads 141-1~141-n, achieves advantages similar to those achieved in the seventh or eighth embodiment. Furthermore, comprehensive functions are fully realized by utilizing the common input pads 141-1~141-n, without having to increase the number of pads.

(Tenth Embodiment)

Figure 20:
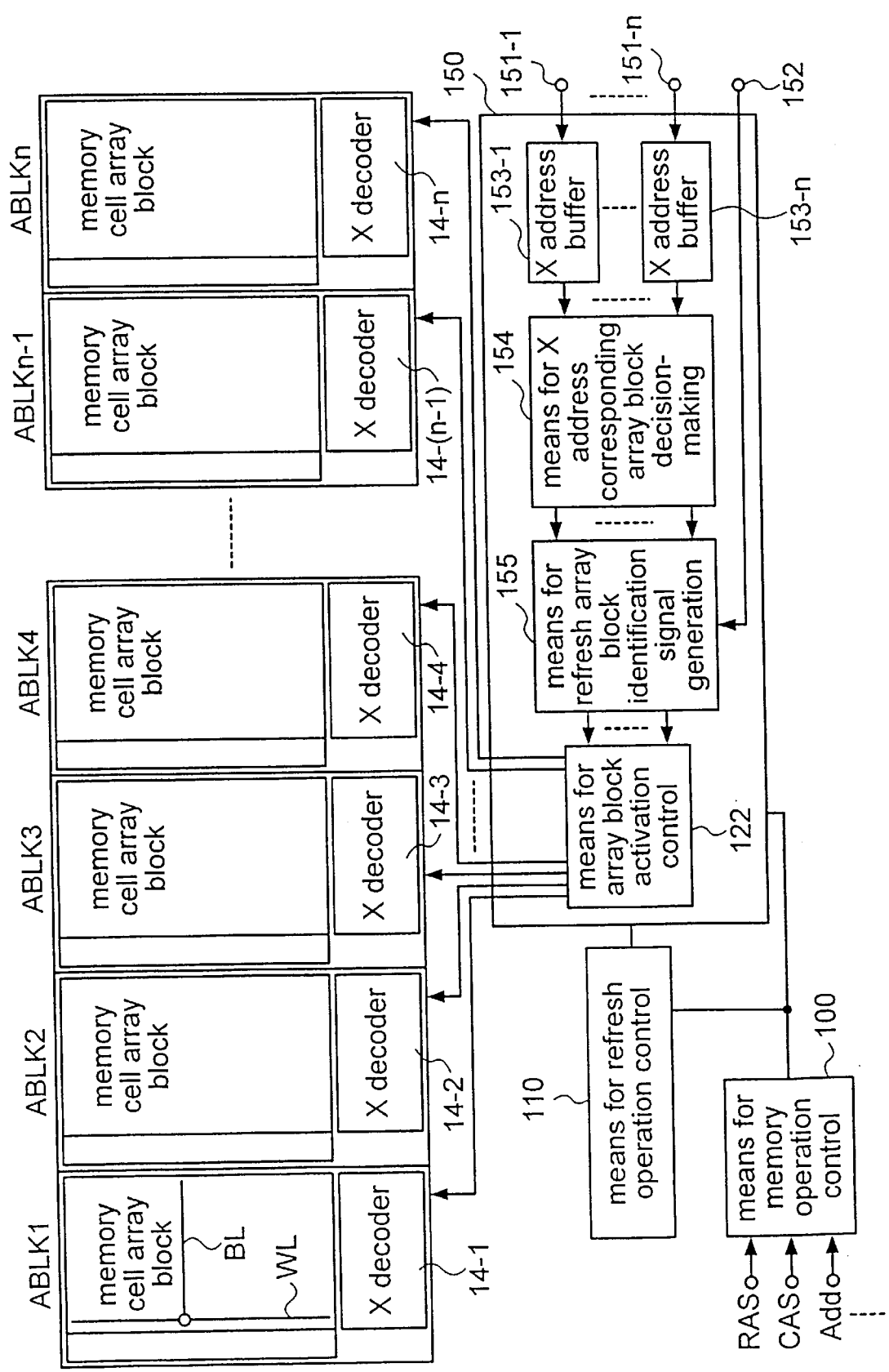
FIG. 20 is a block diagram of the DRAM in a tenth embodiment of the present invention.

FIG. 20 is a block diagram of the DRAM in the tenth embodiment of the present invention.

In the first~ninth embodiments assuming a structure in which individual sets of refresh block data RBDATA corresponding to the blocks ABLK 1~ABLK n are input from the outside, the refresh block data RBDATA need to be created in an external system. In contrast, in the DRAM in the tenth embodiment, a means for refresh block selection 150 to function as a means for block selection information generation is provided, and signals equivalent to refresh block data RBDATA, which constitute block selection information are automatically generated based upon X addresses input through address pads 151-1~151-n. The means for refresh block selection 150 is provided with X address buffers 153-1~153-n respectively connected to the address pads 151-1~151-n, a means for X address corresponding block decision-making connected to the X address buffers 153-1~153-n, a means for refresh array block identification signal generation 155 connected to the means for X address corresponding block decision-making 154 and a means for array block activation control 122 connected to the means for refresh array block identification signal generation 155. The means for refresh array block identification signal generation 155 is provided with refresh on/off data through a pad 152.

Next, the operation performed in the DRAM in FIG. 20 is explained.

In the first~ninth embodiments, the individual sets of refresh block data RBDATA each corresponding to one of the blocks ABLK 1~ABLK n are set to "H" or "L" when setting the blocks ABLK 1~ABLK n to undergo a refresh. In the DRAM in the tenth embodiment, however, one of the X addresses, that is assigned to the block ABLK 1, for instance, is input through the address pads 151-1~151-n to set the block ABLK 1 for a refresh, and the refresh on/off data which indicate that a refresh is to be performed are set to "H" and are provided to the pad 152.

The means for X address corresponding array block decision-making 154 indicates to the means for refresh array block identification signal generation 155 that the block ABLK 1 has been selected in conformance to the X address provided via the X address buffers 153-1~153-n. The means for refresh array block identification signal generation 155 ascertains that the refresh on/off data are set at "H", sets the refresh block specification signal RB corresponding to the block ABLK 1 to "H" and holds the refresh block specification signal RB thus set to "H". Similar processing is performed for the blocks ABLK 2~ABLK n as well as the block ABLK 1 through the decision-making operation by the means for decision-making 154 and the operation performed by the means for generation 155. When the self refresh mode is set after this processing is completed, a self refresh operation is performed on individually selected blocks ABLK 1~ABLK n.

As explained above, in the tenth embodiment provided with the means for X address corresponding array block decision-making 154 and the means for refresh array block identification signal generation 155, it is not necessary to externally generate the refresh block data RBDATA that indicate the blocks ABLK 1~ABLK n to undergo a refresh. In addition, since the address pads 151-1~151-n are utilized to minimize the increase in the number of pads. Furthermore, since the individual blocks ABLK 1~ABLK n can be set to undergo or not undergo a refresh simply by inputting X addresses as in a normal operation, the interface required for the refresh control can be simplified.

It is to be noted that the present invention is not limited to the embodiments explained above and it allows for a number of variations. Such variations include the following.

(1) While the refresh block data RBDATA are input through the DQ pad(s) 62 in the fourth and fifth embodiments, they may be input through the address pad 12.

(2) By providing means equivalent to the means for X address corresponding array block decision-making 154 and the means for refresh array block identification signal generation 155 in the tenth embodiment on the output side of the registers 132-1~132-n and 133-1~133-n in the seventh and eighth embodiments, advantages similar to those achieved in the tenth embodiment are realized.

As explained in detail above, in the DRAM achieved in the first aspect, the means for operation prohibition compares the block selection information with the refresh address and ensures that a refresh is not performed for a block not requiring a refresh by prohibiting operation of the generator. Thus, a self refresh operation can be performed by excluding a block that does not need a self refresh in conformance to the block selection information to reduce power consumption.

In the DRAM achieved in the second aspect, the X pre-decoder compares the block selection information with the refresh address and a refresh operation is not performed for a block not requiring a refresh by prohibiting operation of the X pre-decode signal. Thus, a self refresh operation can be performed by excluding a block specified as not requiring a self refresh, to achieve a reduction in power consumption. In addition, the DRAM in the second aspect, which can be realized simply by changing the structures of the X pre-decoder and the like, only requires minimal modification of the circuit in the prior art.

In the DRAM achieved in the third aspect, the operations of the refresh counter and of the X address buffer are controlled by the means for counter activation when the result of the decision-making performed by the refresh decision-making circuit indicate a refresh mode other than the self refresh mode. Thus, a refresh operation can be performed for selected blocks when, for instance, the CBR refresh mode instead of the self refresh mode is set, without having to modify the circuit. As a result, a reduction in power consumption is achieved.

In the DRAM achieved in the fourth aspect, which assumes a structure in which the block selection information is input over, for instance, one setting cycle via the data pads, the address pads or the like, the block selection information can be input by utilizing the pads provided in the circuit in the prior art without having to provide additional pads dedicated to block selection information input. Thus, since it is not necessary to add new input pads (i.e. input pins), pin compatibility with a DRAM chip in the prior art is achieved.

In the DRAM achieved in the fifth aspect, which assumes a structure in which the block selection information is input into a shift register over, for instance, a plurality of setting cycles via a pad, the block selection information can be input by utilizing the pad provided in the circuit in the prior art without having to provide additional pads dedicated to block selection information input. Thus, since it is not necessary to add new input pads (i.e. input pins), pin compatibility with a DRAM chip in the prior art is achieved. In addition, since the block selection information can be serially input to the shift register, even a large number of refresh blocks to be selected can be supported with ease, free of any restrictions imposed by the number of pins and the like.

In the DRAM achieved in the sixth aspect, the means for refresh mode setting is provided to achieve a function for the DRAM which is identical to the refresh function in the prior art when there is no setting cycle implemented for inputting the block selection information and to enable selection of blocks to be refreshed when the setting cycle is implemented. Thus, the refresh mode in the prior art and the refresh mode which implements block selection can be selectively set. As a result, compatibility with a DRAM having the refresh function of the prior art is achieved.

In the DRAM achieved in the seventh aspect assuming a structure in which a refresh is performed in units of memory cells corresponding to each of a plurality of areas achieved by further dividing each block, an area that does not undergo a refresh can be set within a block that is to undergo a refresh. Thus, an improvement is achieved in the degree of freedom in setting refresh areas to further reduce unnecessary power consumption during refresh operations.

In the DRAM achieved in the eighth aspect assuming a structure provided with the means for switching to input the block selection information and the selection signals through common pads, the increase in the number of pads can be minimized while improving function.

In the DRAM achieved in the ninth aspect provided with the means for block selection information generation, it is not necessary to externally generate block selection information and, at the same time, address pads and the like in the prior art can be utilized to minimize the increase in the number of pads. Furthermore, since the individual blocks can be set to undergo or not to undergo a refresh simply by inputting X addresses as in a normal operation, the interface required for refresh control can be simplified.

The entire disclosure of Japanese Patent Application No. 2000-68969 filed on Mar. 13, 2000 including specification, claims, drawings and summary is incorporated herein by reference in its entirety.

What is claimed is:

1. A dynamic random access memory comprising;
   a plurality of blocks each provided with a plurality of word lines selected by an X address, a plurality of a bit lines and a plurality of memory cells for data storage connected to said word lines and said bit lines;
   a refresh decision-making circuit that detects whether or not a refresh is requested for said plurality of memory cells based upon a control signal provided from the outside and makes a decision with regard to a mode thereof;
   a refresh timer that is activated when the result of the decision-making performed by said refresh decision-making circuit indicate a self refresh mode to generate a timing signal;
   a generator that generates a counter control clock that is synchronous with said timing signal;
   a refresh counter that is activated when said results of said decision-making performed by said refresh decision-making circuit indicate said self refresh mode to generate and output a refresh address for a refresh in synchronization with said counter control clock;
   an X address buffer that stores said refresh address when said result of said decision-making performed by said refresh decision-making circuit indicates said self refresh mode and stores an X address provided from the outside when said result of said decision-making performed by said refresh decision-maldng circuit do not indicate said self refresh mode;
   a means for latching that latches block selection information indicating whether or not a refresh needs to be performed for the blocks provided from the outside with specific timing;
   an X pre-decoder that pre-decodes the address stored in said X address buffer to select the block and outputs a pre-decode signal containing said selection information;
   an X decoder that decodes said pre-decode signal and selects a word line corresponding to said memory cells within the block selected by said X pre-decoder;
   a means for operation prohibition that compares said block selection information latched by said means for latching with said refresh address and prohibits operation of said generator if said refresh address indicates a block that does not need to be refreshed; and
   a means for clock route changing that provides said timing signal to said refresh counter instead of said counter control clock when the operation of said generator is prohibited.

2. A dynamic random access memory according to claim 1, wherein;
   the block selection information is input via a pad through which said data are input from/output to the outside or via a pad through which said X address is input from the outside.

3. A dynamic random access memory according to claim 2, wherein;
   a shift register connected to said pad is provided in place of said means for latching to latch the block selection information with said shift register.

4. A dynamic random access memory according to claim 2, further comprising;
   a means for block selection information generation that predecodes said X address input via said pad from the outside and generates the block selection information based upon the decoding results.

5. A dynamic random access memory according to claim 1, wherein;
   a selection signal indicating whether or not a refresh is required for each of a plurality of areas achieved by further dividing each of the blocks is input and said refresh is performed only on memory cells in an area requiring a refresh within a block requiring the refresh.

6. A dynamic random access memory according to claim 5, with said block selection information and said selection signal input through a common pad, further comprising;
   a means for switching that switches between a recipient of said block selection information that has been input and a recipient of said selection signal that has been input.

7. A dynamic random access memory, comprising;
   a plurality of blocks;
   a refresh decision-making circuit;
   a refresh timer;
   a generator;
   a refresh counter;
   a refresh address buffer; and
   a means for latching, all according to claim 1, further comprising;
      an X pre-decoder that compares said block selection information latched by said means for latching with a refresh address stored at said X address buffer when the result of the decision-making performed by said refresh decision-making circuit indicate a self refresh mode and outputs a pre-decode signal at a first potential containing information indicating that a refresh address specifies a block that needs to be refreshed and sets said pre-decode signal to a second potential if said refresh address specifies a block that does not need to be refreshed; and
      an X decoder that decodes said pre-decode signal at said first potential output by said X pre-decoder to select a word line corresponding to said memory cells within said block specified by said X pre-decoder, with a word line selection operation thereof prohibited when said pre-decode signal is set to said second potential.

8. A dynamic random access memory according to claim 7, wherein;
   the block selection information is input via a pad through which said data are input from/output to the outside or via a pad through which said X address is input from the outside.

9. A dynamic random access memory according to claim 8, wherein;
   a shift register connected to said pad is provided in place of said means for latching to latch the block selection information with said shift register.

10. A dynamic random access memory according to claim 8, further comprising;
    a means for block selection information generation that pre-decodes said X address input via said pad from the outside and generates the block selection information based upon the decoding results.

11. A dynamic random access memory according to claim 7, wherein;
    a selection signal indicating whether or not a refresh is required for each of a plurality of areas achieved by further dividing each of the blocks is input and said refresh is performed only on memory cells in an area requiring a refresh within a block requiring the refresh.

12. A dynamic random access memory according to claim 11, with the block selection information and said selection signal input through a common pad, further comprising;
    a means for switching that switches between a recipient of said block selection information that has been input and a recipient of said selection signal that has been input.

13. A dynamic random access memory according to claim 7, further comprising;
    a means for refresh mode setting that has a function of setting a first refresh mode for performing a selective block refresh on said blocks and a second refresh mode for performing a refresh for all of said blocks, causes said X pre-decoder to output a pre-decode signal capable of achieving said first and said second potential when said first refresh mode is set and provides a signal that prohibits said pre-decode signal from shifting to said second potential to said X pre-decoder when said second refresh mode is set.

14. A dynamic random access memory comprising;
    a plurality of blocks each provided with a plurality of word lines selected by an X address, a plurality of a bit lines and a plurality of memory cells for data storage connected to said word lines and said bit lines;
    a refresh decision-making circuit that detects whether or not a refresh is requested for said plurality of memory cells based upon a control signal provided from the outside and makes a decision with regard to a mode thereof;
    a refresh timer that is activated when the result of the decision-making performed by said refresh decision-making circuit indicate a self refresh mode to generate a timing signal;
    a generator that generates a counter control clock that is synchronous with said timing signal;
    a means for counter activation that outputs an activation signal set to a first potential when said result of said decision-making performed by said refresh decision-making circuit indicate said self refresh mode or a refresh mode other than said self refresh mode and set to a second potential if said result of said decision-making indicate neither said self refresh mode nor a refresh mode other than said self refresh mode;
    a refresh counter that is activated by said activation signal set to the first potential to generate and output a refresh address for a refresh in synchronization with said counter control clock;
    an X address buffer having said activation signal input therein, that stores said refresh address when said activation signal is at said first potential and stores an X address provided from the outside when said activation signal is set to said second potential;
    a means for latching that latches block selection information indicating whether or not said blocks need to be refreshed and provided from the outside with specific timing;
    an X pre-decoder that compares said block selection information latched by said means for latching with said refresh address stored at said X address buffer, outputs a pre-decode signal at said first potential containing information indicating that a block specified by said refresh address requires a refresh and sets said pre-decode signal to said second potential if said refresh address specifies a block that does not need to be refreshed; and an X decoder that decodes said pre-decode signal at said first potential output by said X pre-decoder to select a word line corresponding to said memory cells within said block specified by said X pre-decoder with a word line selection operation thereof prohibited if said pre-decode signal is set at said second potential.

15. A dynamic random access memory according to claim 14, wherein;

the block selection information is input via a pad through which said data are input from/output to the outside or via a pad through which said X address is input from the outside.

16. A dynamic random access memory according to claim 15, wherein;

a shift register connected to said pad is provided in place of said means for latching to latch the block selection information with said shift register.

17. A dynamic random access memory according to claim 15, further comprising;

a means for block selection information generation that pre-decodes said X address input via said pad from the outside and generates the block selection information based upon the decoding results.

18. A dynamic random access memory according to claim 14, wherein;

a selection signal indicating whether or not a refresh is required for each of a plurality of areas achieved by further dividing each of the blocks is input and said refresh is performed only on memory cells in an area requiring a refresh within a block requiring the refresh.

19. A dynamic random access memory according to claim 18, with the block selection information and said selection signal input through a common pad, further comprising;

a means for switching that switches between a recipient of said block selection information that has been input and a recipient of said selection signal that has been input.

20. A dynamic random access memory according to claim 14, further comprising;

a means for refresh mode setting that has a function of setting a first refresh mode for performing a selective block refresh on said blocks and a second refresh mode for performing a refresh for all of said blocks, causes said X pre-decoder to output a pre-decode signal capable of achieving said first and said second potential when said first refresh mode is set and provides a signal that prohibits said pre-decode signal from shifting to said second potential to said X pre-decoder when said second refresh mode is set.

* * * * *